United States Patent
Kim et al.

(10) Patent No.: US 9,769,956 B2
(45) Date of Patent: *Sep. 19, 2017

(54) SILICON-BASED COOLING PACKAGE FOR COOLING AND THERMALLY DECOUPLING DEVICES IN CLOSE PROXIMITY

(71) Applicants: Gerald Ho Kim, Carlsbad, CA (US); Jay Eunjae Kim, Bellevue, WA (US)

(72) Inventors: Gerald Ho Kim, Carlsbad, CA (US); Jay Eunjae Kim, Bellevue, WA (US)

(*) Notice: Subject to any disclaimer, the term of this patent is extended or adjusted under 35 U.S.C. 154(b) by 162 days.

This patent is subject to a terminal disclaimer.

(21) Appl. No.: 14/742,615

(22) Filed: Jun. 17, 2015

(65) Prior Publication Data
US 2015/0289408 A1 Oct. 8, 2015

Related U.S. Application Data

(63) Continuation of application No. 13/835,105, filed on Mar. 15, 2013, now Pat. No. 9,089,075.
(Continued)

(51) Int. Cl.
*H01S 3/04* (2006.01)
*H05K 7/20* (2006.01)
(Continued)

(52) U.S. Cl.
CPC ......... *H05K 7/2039* (2013.01); *F28F 21/065* (2013.01); *H01L 23/367* (2013.01);
(Continued)

(58) Field of Classification Search
CPC ...... H01S 3/0407; H01S 3/042; H01S 3/0405; H01S 5/02407; H01S 5/02423;
(Continued)

(56) References Cited

U.S. PATENT DOCUMENTS

| 7,190,582 | B2 * | 3/2007 | Tonosaki | F28D 15/0266 |
| | | | | 165/104.26 |
| 8,514,901 | B2 * | 8/2013 | Kim | H01S 3/0407 |
| | | | | 165/104.11 |

(Continued)

*Primary Examiner* — Tod T Van Roy
*Assistant Examiner* — Delma R Forde
(74) *Attorney, Agent, or Firm* — Andy M. Han

(57) ABSTRACT

Various embodiments of an apparatus that simultaneously cools and thermally decouples adjacent electrically-driven devices in close proximity are provided. In one aspect, an apparatus comprises a first non-silicon heat sink and a first silicon-based heat sink disposed on the first non-silicon heat sink. The first silicon-based heat sink is configured to receive a first electrically-driven device on a first portion of the first silicon-based heat sink and to receive a second electrically-driven device on a second portion of the first silicon-based heat sink. The first silicon-based heat sink includes a first groove or a first opening between the first portion and the second portion such that a heat conduction path between the first electrically-driven device and the first non-silicon heat sink through the first silicon-based heat sink is shorter than a heat conduction path between the first electrically-driven device and the second electrically-driven device through the first silicon-based heat sink.

20 Claims, 13 Drawing Sheets

Related U.S. Application Data

(60) Provisional application No. 61/616,301, filed on Mar. 27, 2012.

(51) Int. Cl.
| | | |
|---|---|---|
| *F28F 21/06* | (2006.01) | |
| *H01L 23/367* | (2006.01) | |
| *H01L 23/373* | (2006.01) | |
| *H01L 25/16* | (2006.01) | |
| *H01L 31/024* | (2014.01) | |
| *H01S 5/022* | (2006.01) | |
| *H01S 5/024* | (2006.01) | |
| *H01S 5/183* | (2006.01) | |

(52) U.S. Cl.
CPC ...... *H01L 23/3675* (2013.01); *H01L 23/3738* (2013.01); *H01L 25/167* (2013.01); *H01L 31/024* (2013.01); *H01S 5/02248* (2013.01); *H01S 5/02469* (2013.01); *H01S 5/183* (2013.01); *H01L 2924/0002* (2013.01)

(58) Field of Classification Search
CPC .. H01S 5/02248; H01S 5/02469; H01S 5/183; H05K 7/2039; F28F 21/065; H01L 23/367; H01L 23/3738; H01L 2924/0002; H01L 2924/00; H01L 23/3675; H01L 25/167; H01L 31/024
USPC ...... 372/34–36; 165/185, 104.34, 80.4, 80.3, 165/104.33; 257/712–714; 361/679.54, 361/704–713
See application file for complete search history.

(56) References Cited

U.S. PATENT DOCUMENTS

| | | | |
|---|---|---|---|
| 8,755,418 B2* | 6/2014 | Kim | H01S 3/0407 372/34 |
| 2008/0069160 A1* | 3/2008 | Stephens | H01S 5/02423 372/35 |
| 2008/0181277 A1* | 7/2008 | Konig | H01S 5/02461 372/49.01 |
| 2014/0160685 A1* | 6/2014 | Kim | H05K 7/2039 361/720 |
| 2014/0321489 A1* | 10/2014 | Kim | H01L 33/641 372/36 |
| 2015/0098191 A1* | 4/2015 | Kim | H01L 23/3675 361/705 |

* cited by examiner

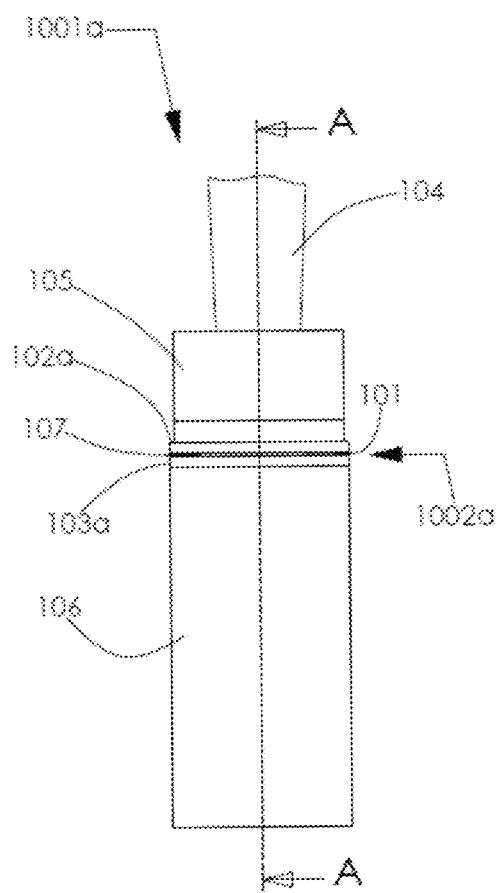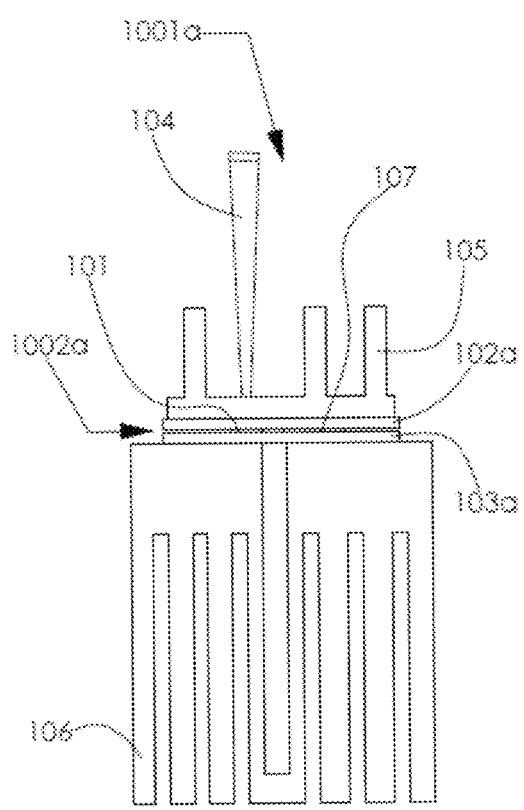
FIG. 3
FIG. 4

SILICON-BASED COOLING PACKAGE FOR COOLING AND THERMALLY DECOUPLING DEVICES IN CLOSE PROXIMITY

CROSS REFERENCE TO RELATED PATENT APPLICATIONS

This a continuation application of U.S. Utility patent application Ser. No. 13/835,105, filed on Mar. 15, 2013, which claims the priority benefit of U.S. Provisional Patent Application No. 61/616,301, filed on Mar. 27, 2012. These applications are incorporated by reference in their entirety.

BACKGROUND

Technical Field

The present disclosure generally relates to the field of transfer of thermal energy and, more particularly, to removal of thermal energy from electrically-driven devices in close proximity.

Description of the Related Art

There are many applications, ranging from consumer electronics to telecommunications and the like, in which electrically-driven devices (e.g., semiconductor-based integrated circuits) capable of performing various tasks are packed in close proximity in a small form factor to serve various needs. Such electrically-driven devices may include, for example, driver circuits, logic processors, graphics processors, laser diodes including edge-emitting lasers and vertical-cavity surface-emitting lasers (VCSELs), light-emitting diodes (LEDs), photodiodes, sensors, etc. Many of such electrically-driven devices inevitably generate thermal energy, or heat, in operation. As the number and complexity of the functionalities performed by such electrically-driven devices continue to increase and as the distance between electrically-driven devices in the small form factor continues to decrease, heat generated by such electrically-driven devices present some technical challenges that need to be addressed.

For one thing, performance, useful lifespan, or both of an electrically-driven device may be significantly impacted if the heat generated by the device is not adequately dissipated or otherwise removed from the device. Moreover, given the close proximity between two or more electrically-driven devices in some applications, a phenomenon of thermal coupling between the two or more devices may occur and result in the heat generated by one of the devices being transferred to one or more adjacent devices. More specifically, when thermal coupling occurs and when an adequate heat transfer mechanism is lacking, heat generated by electrically-driven devices in close proximity may detrimentally deteriorate the performance and useful lifespan of some or all of the affected devices.

Many metal-based heat dissipation or cooling packages, whether water-cooled or air-cooled, have been developed for use in compact form factor to dissipate heat generated by electrically-driven devices in small form factors. For instance, heat exchangers and heat pipes made of a material with high thermal conductivity, such as copper, copper-tungsten alloy, aluminum or iron, for example, are commercially available. However, most metal-based heat exchangers and heat pipes tend to experience oxidation, corrosion and/or crystallization after long periods of operation. Such fouling factors significantly reduce the efficiency of heat transfer of metal-based cooling packages. Other problems associated with metal-based cooling packages include, for example, difficulty in precision alignment in mounting laser diode bars, VCSELs, LEDs or chips in laser diode/VCSEL/LED cooling applications, issues with overall compactness of the package, corrosion of the metallic material in water-cooled applications, difficulty in manufacturing, high-precision fabrication, electrical isolation, etc. Yet, increasing demand for higher power density in small form factor motivates the production of a compact cooling package with fewer or none of the aforementioned issues. Moreover, conventional packages typically use wire bonding to provide electrical power to the electrically-driven device(s) being cooled, but wire bonding may add cost and complexity in manufacturing and may be prone to defects in addition to occupying space unnecessarily.

SUMMARY

Various embodiments of a cooling package apparatus that cools and thermally decouples electrically-driven devices in close proximity are provided. As would be appreciated by those of ordinary skill in the art, the disclosed apparatus, with the innovative use of silicon-based heat sinks, resolves some of the aforementioned issues by simultaneously cooling and thermally decoupling electrically-driven devices that are in close proximity and packed in a small form factor. In addition, the disclosed techniques advantageously reduce the complexity as well as the cost associated with the manufacturing of the cooling package apparatus.

In one aspect, an apparatus may include a first silicon-based heat sink and a second silicon-based heat sink. The first silicon-based heat sink may be configured to be disposed on a first non-silicon heat sink. The first silicon-based heat sink may also be configured to receive a first electrically-driven device on a first portion of the first silicon-based heat sink and further configured to receive a second electrically-driven device on a second portion of the first silicon-based heat sink. The first silicon-based heat sink may include a first groove or a first opening between the first portion and the second portion such that a heat conduction path between the first electrically-driven device and the first non-silicon heat sink through the first silicon-based heat sink is shorter than a heat conduction path between the first electrically-driven device and the second electrically-driven device through the first silicon-based heat sink. The second silicon-based heat sink may be configured to be disposed on the first electrically-driven device and the second electrically-driven device such that the first silicon-based heat sink and the second silicon-based heat sink sandwich the first electrically-driven device and the second electrically-driven device therebetween with a first portion of the second silicon-based heat sink in contact with the first electrically-driven device and a second portion of the second silicon-based heat sink in contact with the second electrically-driven device. The second silicon-based heat sink may include a second groove or a second opening between the first portion and the second portion of the second silicon-based heat sink.

In one implementation, at least one of the first silicon-based heat sink or the second silicon-based heat sink may include a silicon-based plate made of single-crystal silicon.

In one implementation, at least one of the first silicon-based heat sink or the second silicon-based heat sink may further include one or more additional grooves or one or more additional openings that increase the heat conduction path between the first electrically-driven device and the second electrically-driven device through the at least one of the first silicon-based heat sink or the second silicon-based heat sink having the one or more additional grooves or the one or more additional openings.

In one implementation, the first silicon-based heat sink may include a first primary surface and a second primary surface opposite to the first primary surface. The first primary surface of the first silicon-based heat sink may be configured to be disposed on the first non-silicon heat sink. The first and second electrically-driven devices may be disposed on the second primary surface of the first silicon-based heat sink. The second silicon-based heat sink may include a first primary surface and a second primary surface opposite to the first primary surface. The first primary surface of the second silicon-based heat sink may be in contact with the first and second electrically-driven devices.

In one implementation, either or both of the second primary surface of the first silicon-based heat sink and the first primary surface of the second silicon-based heat sink may include one or more metallic patterns deposited thereon such that the first electrically-driven device is operable to drive the second electrically-driven device by providing electricity through the one or more metallic patterns when the first electrically-driven device and the second electrically-driven device are disposed between the first silicon-based heat sink and the second silicon-based heat sink.

In one implementation, the second portion of the second silicon-based heat sink may include at least one additional opening that at least partially exposes a surface of the second electrically-driven device facing the second silicon-based heat sink when the second electrically-driven device is disposed between the first silicon-based heat sink and the second silicon-based heat sink.

In one implementation, the apparatus may also include the first non-silicon heat sink on which the first silicon-based heat sink is disposed. In one implementation, a thermal conductivity of the first non-silicon heat sink may be greater than a thermal conductivity of the first silicon-based heat sink.

In one implementation, the apparatus may further include a second non-silicon heat sink disposed on the second silicon-based heat sink. In one implementation, a thermal conductivity of the second non-silicon heat sink may be greater than a thermal conductivity of the second silicon-based heat sink.

In one implementation, the second portion of the second silicon-based heat sink may include at least one additional opening. A portion of the second non-silicon heat sink aligned with the second portion of the second silicon-based heat sink may include an opening such that at least a portion of a surface of the second electrically-driven device facing the second silicon-based heat sink is exposed through the at least one additional opening of the second silicon-based heat sink and the opening of the second non-silicon heat sink when the second electrically-driven device is disposed between the first silicon-based heat sink and the second silicon-based heat sink.

In one implementation, the apparatus may further include the first electrically-driven device and the second electrically-driven device. The first electrically-driven device may be disposed on the first portion of the first silicon-based heat sink and between the first silicon-based heat sink and the second silicon-based heat sink. The second electrically-driven device may be disposed on the second portion of the first silicon-based heat sink and between the first silicon-based heat sink and the second silicon-based heat sink.

In one implementation, the second electrically-driven device may be electrically driven by the first electrically-driven device.

In one implementation, the first electrically-driven device may include a driver circuit, and the second electrically-driven device may include a laser diode or a sensor.

In one implementation, the first electrically-driven device may include a laser driver circuit or a radio frequency (RF) driver circuit.

In one implementation, the second electrically-driven device may include an edge-emitting laser, a vertical-cavity surface-emitting laser (VCSEL), or a photo-diode.

In another aspect, an apparatus may include a first non-silicon heat sink, a first electrically-driven device, a second electrically-driven device, a first silicon-based heat sink and a second silicon-based heat sink. The first silicon-based heat sink may be disposed on the first non-silicon heat sink. The first silicon-based heat sink may be configured to receive the first electrically-driven device on a first portion of the first silicon-based heat sink and further configured to receive the second electrically-driven device on a second portion of the first silicon-based heat sink. The first silicon-based heat sink may include a first groove or a first opening between the first portion and the second portion such that a heat conduction path between the first electrically-driven device and the first non-silicon heat sink through the first silicon-based heat sink is shorter than a heat conduction path between the first electrically-driven device and the second electrically-driven device through the first silicon-based heat sink. The second silicon-based heat sink may be configured to be disposed on the first electrically-driven device and the second electrically-driven device such that the first silicon-based heat sink and the second silicon-based heat sink sandwich the first electrically-driven device and the second electrically-driven device therebetween with a first portion of the second silicon-based heat sink in contact with the first electrically-driven device and a second portion of the second silicon-based heat sink in contact with the second electrically-driven device. The second silicon-based heat sink may include a second groove or a second opening between the first portion and the second portion of the second silicon-based heat sink. The first electrically-driven device may be disposed on the first portion of the first silicon-based heat sink and between the first silicon-based heat sink and the second silicon-based heat sink. The second electrically-driven device may be disposed on the second portion of the first silicon-based heat sink and between the first silicon-based heat sink and the second silicon-based heat sink.

In one implementation, the apparatus may further include a second non-silicon heat sink disposed on the second silicon-based heat sink.

In one implementation, a thermal conductivity of the first non-silicon heat sink may be greater than a thermal conductivity of the first silicon-based heat sink, and a thermal conductivity of the second non-silicon heat sink may be greater than a thermal conductivity of the second silicon-based heat sink.

In one implementation, the first silicon-based heat sink may include a first primary surface and a second primary surface opposite to the first primary surface. The first primary surface of the first silicon-based heat sink may be configured to be disposed on the first non-silicon heat sink. The first and second electrically-driven devices may be disposed on the second primary surface of the first silicon-based heat sink. The second silicon-based heat sink may include a first primary surface and a second primary surface opposite to the first primary surface. The first primary surface of the second silicon-based heat sink may be in contact with the first and second electrically-driven devices. Either or both of the second primary surface of the first silicon-based heat sink and the first primary surface of the second silicon-based heat sink may include one or more metallic patterns deposited thereon such that the first electrically-driven device is operable to drive the second electrically-driven device by providing electricity through the one or more metallic patterns when the first electrically-driven device and the second electrically-driven device are disposed between the first silicon-based heat sink and the second silicon-based heat sink.

The above summary is provided to introduce concepts relating to an apparatus that cools and thermally decouples electrically-driven devices in close proximity. The proposed techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 3 is a side view of the apparatus of FIG. 1 in accordance with one embodiment of the present disclosure.

FIG. 4 is a front view of the apparatus of FIG. 1 in accordance with one embodiment of the present disclosure.

DETAILED DESCRIPTION OF THE DISCLOSED EMBODIMENTS

Overview

The present disclosure describes embodiments of an apparatus that simultaneously cools and thermally decouples electrically-driven devices that are in close proximity, e.g., packed in a small form factor. In one aspect of the apparatus, at least one silicon-based heat sink is in direct contact with two adjacent electrically-driven devices and provides a heat conduction path through which at least some of the heat generated by each of the electrically-driven devices can be dissipated. The at least one silicon-based heat sink is designed with physical features, such as one or more grooves or one or more openings, which promote thermal decoupling between the two adjacent electrically-driven devices. The at least one silicon-based heat sink may be disposed on a non-silicon heat sink with a thermal conductivity that is greater/higher than that of the at least one silicon-based heat sink. This promotes heat transfer from the at least one silicon-based heat sink to the non-silicon heat sink, thereby aiding removal of heat from the electrically-driven devices.

Alternatively, another silicon-based heat sink may be disposed on the electrically-driven devices such that the two silicon-based heat sinks sandwich the electrically-driven devices therebetween. This allows at least some of the heat generated by each of the electrically-driven devices to be dissipated through the two silicon-based heat sinks. Each of the two silicon-based heat sinks is designed with physical features, such as one or more grooves or one or more openings, which promote thermal decoupling between the two adjacent electrically-driven devices.

While aspects of the disclosed embodiments and techniques may be implemented in any number of different applications, for the purpose of illustration the disclosed embodiments are described in context of the following exemplary configurations.

Illustrative Apparatus

FIGS. 1-6 illustrate an apparatus 1001a in accordance with a plurality of embodiments of the present disclosure. The following description pertains to features depicted in FIGS. 1-6.

In one embodiment, the apparatus 1001a comprises a first non-silicon heat sink 106 and a first silicon-based heat sink 103a that is disposed on the first non-silicon heat sink 106. The first non-silicon heat sink 106 may be metal-based and may be made of, for example, copper, copper-tungsten alloy, aluminum, iron or any suitable metallic material. The first silicon-based heat sink 103a may comprise a silicon-based plate made of single-crystal silicon. The material of the first non-silicon heat sink 106 is chosen so that the thermal conductivity of the first non-silicon heat sink 106 is greater than the thermal conductivity of the first silicon-based heat sink 103a.

Figure 1:
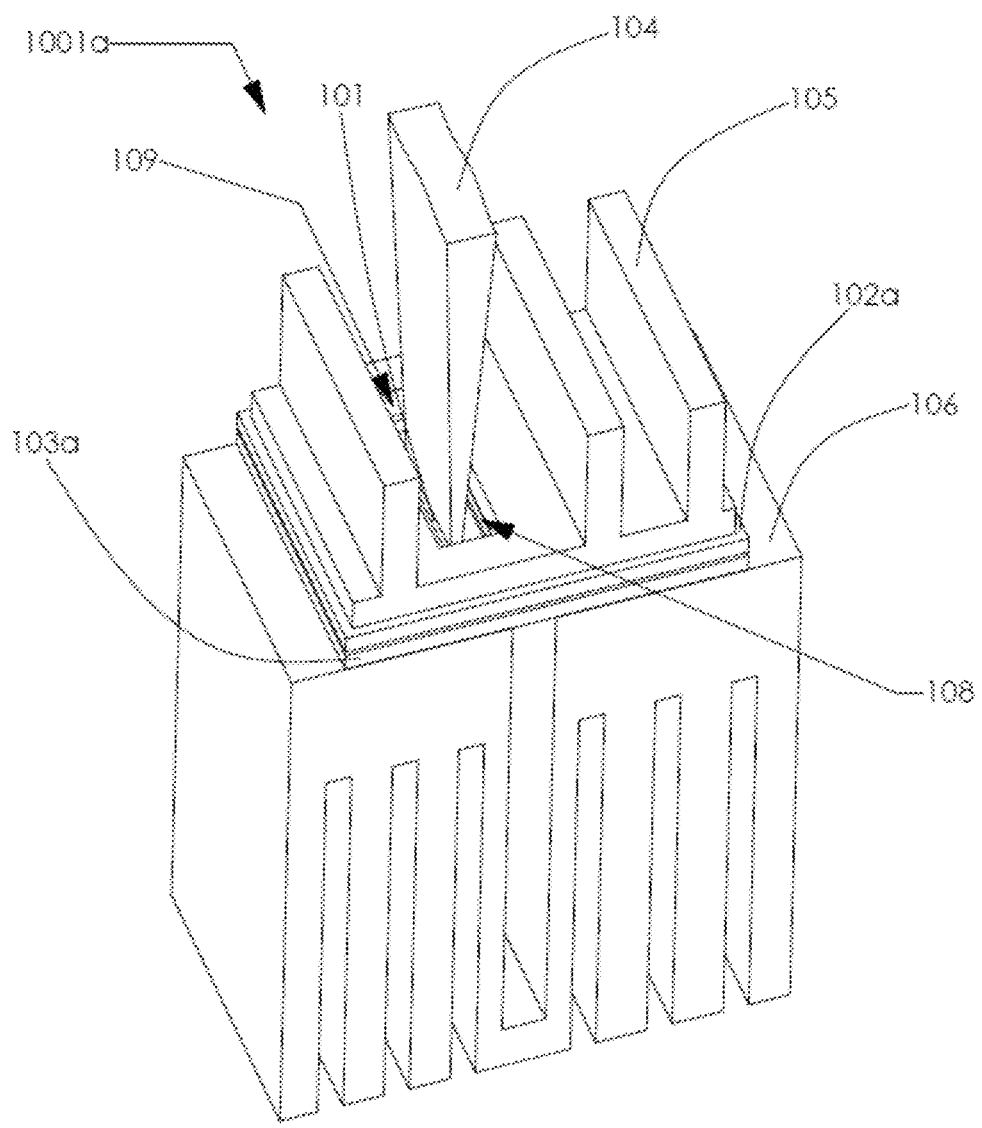
FIG. 1 is a perspective view of an apparatus in accordance with one embodiment of the present disclosure.
Figure 2:
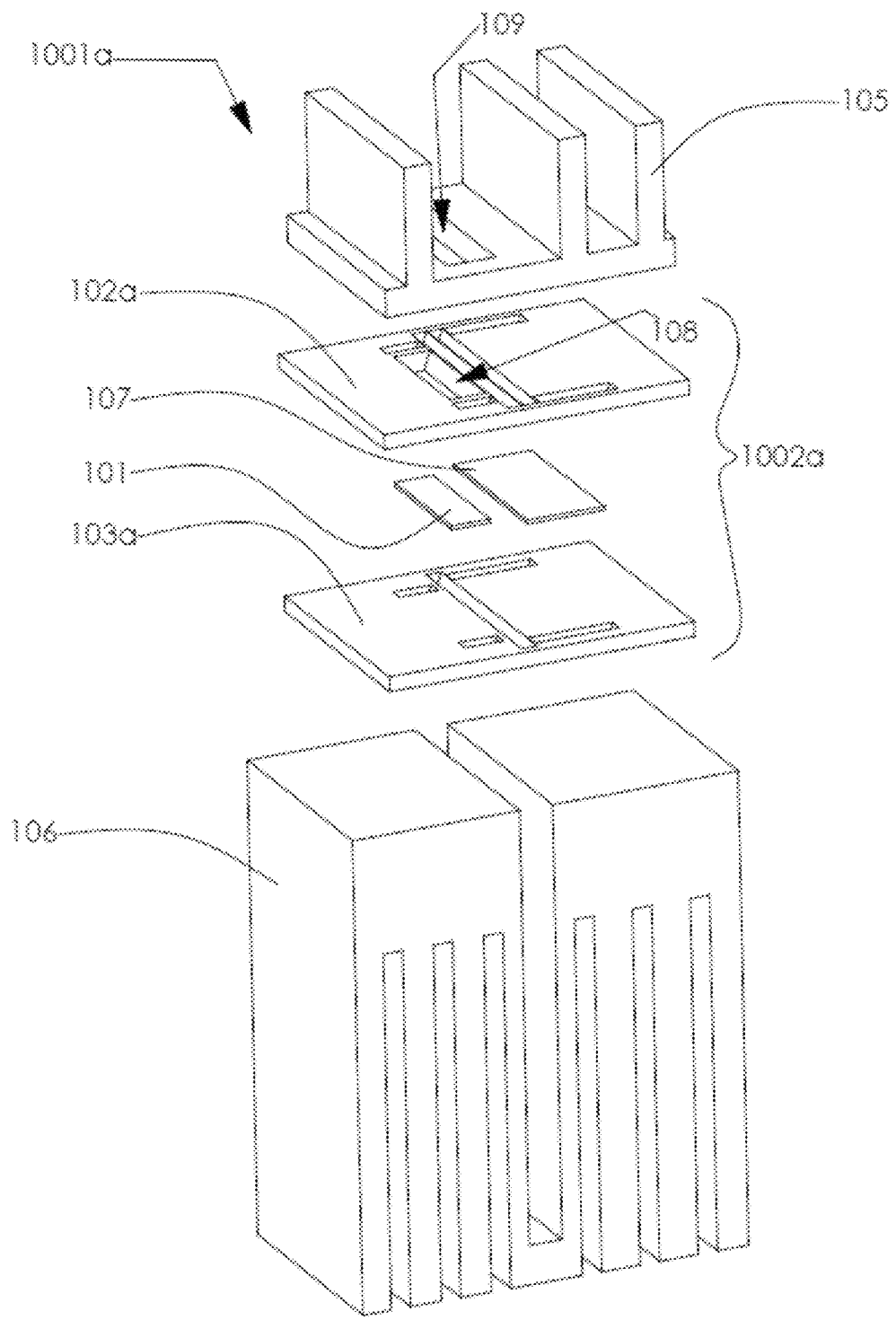
FIG. 2 is an exploded view of the apparatus of FIG. 1 in accordance with one embodiment of the present disclosure.
Figure 5:
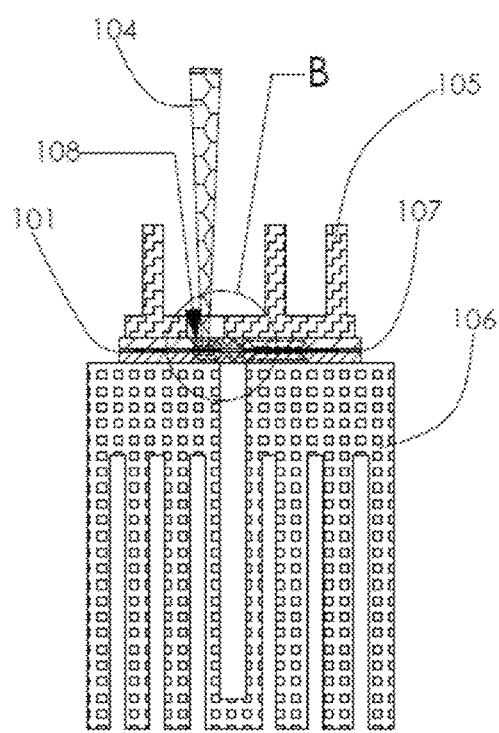
FIG. 5 is a cross-sectional view of the apparatus of FIG. 1 in accordance with one embodiment of the present disclosure.
Figure 6:
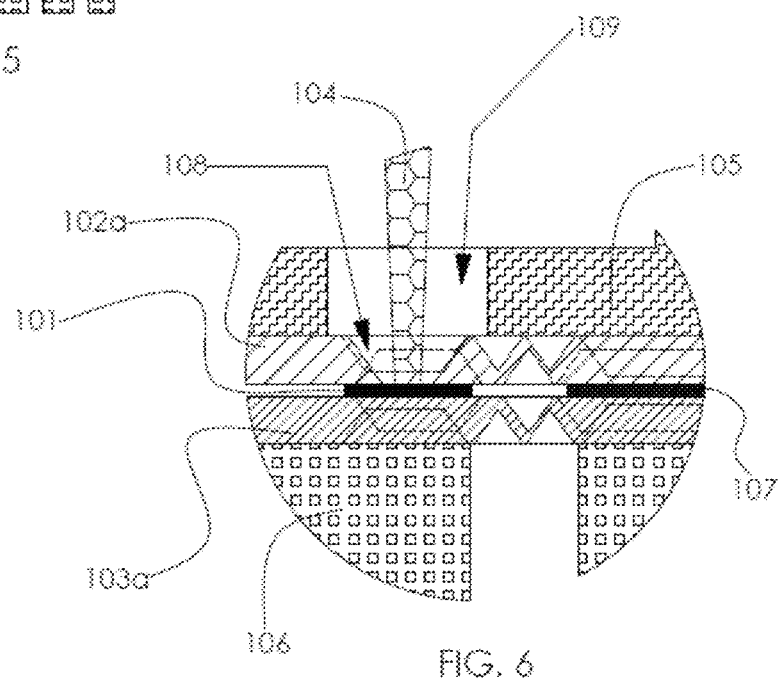
FIG. 6 is a magnified view of a portion of the apparatus as shown in FIG. 5 in accordance with one embodiment of the present disclosure.

The first silicon-based heat sink 103a includes a first primary surface (i.e., the surface that faces and is in contact with the first non-silicon heat sink 106) and a second primary surface (i.e., the surface that faces away from the first non-silicon heat sink 106), which is opposite to the first primary surface. The first silicon-based heat sink 103a is configured to receive a first electrically-driven device 107 on a first portion of the first silicon-based heat sink 103a (i.e., the right half of the first silicon-based heat sink 103a as shown in FIG. 2) on the second primary surface and to receive a second electrically-driven device 101 on a second portion of the first silicon-based heat sink 103a (i.e., the left half of the first silicon-based heat sink 103a as shown in FIG. 2) on the second primary surface. As the first electrically-driven device 107 and the second electrically-driven device 101 are disposed on and in contact with the first silicon-based heat sink 103a, the first silicon-based heat sink 103a serves as a heat transfer mechanism that transfers heat away from the first electrically-driven device 107 and the second electrically-driven device 101 by conduction to aid cooling of the first and second electrically-driven devices 107 and 101.

The first silicon-based heat sink 103a includes one or more grooves and/or openings between the first portion and the second portion of the first silicon-based heat sink 103a. More about the one or more grooves and/or openings will be described later with reference to FIGS. 7-18. The one or more grooves and/or openings serve to maximize a heat conduction path between the first electrically-driven device 107 and the second electrically-driven device 101 such that a heat conduction path between the first electrically-driven device 107 and the first non-silicon heat sink 106 through the first silicon-based heat sink 103a is shorter than the heat conduction path between the first electrically-driven device 107 and the second electrically-driven device 101 through the first silicon-based heat sink 103a. In order for heat generated by the first electrically-driven device 107 to travel to the second electrically-driven device 101, or vice versa, by conduction through the first silicon-based heat sink 103a, the heat conduction path would require meandering around the one or more grooves and/or openings. As such, heat generated by each of the first electrically-driven device 107 and the second electrically-driven device 101 would more easily reach the first non-silicon heat sink 106 by conduction through the first silicon-based heat sink 103a than reaching the other electrically-driven device 107 or 101 by conduction through the first silicon-based heat sink 103a given the long heat conduction path as a result of the one or more grooves and/or openings. Accordingly, thermal decoupling with respect to the first electrically-driven device 107 and the second electrically-driven device 101 is achieved.

The apparatus 1001a may further comprise a second silicon-based heat sink 102a having a first primary surface (i.e., the surface that faces and is in contact with the first electrically-driven device 107 and the second electrically-driven device 101) and a second primary surface (i.e., the surface that faces away from the first electrically-driven device 107 and the second electrically-driven device 101), which is opposite to the first primary surface. The second silicon-based heat sink 102a may comprise a silicon-based plate made of single-crystal silicon.

The second silicon-based heat sink 102a is configured to be disposed on the first electrically-driven device 107 and the second electrically-driven device 101 when the first and second electrically-driven devices 107 and 101 are disposed on the second primary surface of the first silicon-based heat sink 103a. Accordingly, the first silicon-based heat sink 103a and the second silicon-based heat sink 102a sandwich the first electrically-driven device 107 and the second electrically-driven device 101 therebetween with a first portion of the first primary surface of the second silicon-based heat sink 102a (i.e., the right half of the second silicon-based heat sink 102a as shown in FIG. 2) in contact with the first electrically-driven device 107 and a second portion of the first primary surface of the second silicon-based heat sink 102a (i.e., the left half of the second silicon-based heat sink 102a as shown in FIG. 2) in contact with the second electrically-driven device 101. As the first electrically-driven device 107 and the second electrically-driven device 101 are in contact with the second silicon-based heat sink 102a, the second silicon-based heat sink 102a also serves as a heat transfer mechanism that transfers heat away from the first electrically-driven device 107 and the second electrically-driven device 101 by conduction to further aid cooling of the first and second electrically-driven devices 107 and 101.

The second silicon-based heat sink 102a also includes one or more grooves and/or openings between the first portion and the second portion of the second silicon-based heat sink 102a. More about the one or more grooves and/or openings will be described later with reference to FIGS. 7-18. The one or more grooves and/or openings serve to maximize a heat conduction path between the first electrically-driven device 107 and the second electrically-driven device 101 such that a heat conduction path between the first electrically-driven device 107 and the first non-silicon heat sink 106 through the second silicon-based heat sink 102a is shorter than the heat conduction path between the first electrically-driven device 107 and the second electrically-driven device 101 through the second silicon-based heat sink 102a. In order for heat generated by the first electrically-driven device 107 to travel to the second electrically-driven device 101, or vice versa, by conduction through the second silicon-based heat sink 102a, the heat conduction path would require meandering around the one or more grooves and/or openings. Again, thermal decoupling with respect to the first electrically-driven device 107 and the second electrically-driven device 101 is achieved.

The second portion of the second silicon-based heat sink 102a may include an opening that at least partially exposes a surface of the second electrically-driven device 101 facing the second silicon-based heat sink 102a when the second electrically-driven device 101 is disposed between the first silicon-based heat sink 103a and the second silicon-based heat sink 102a. This feature is useful when the second electrically-driven device 101 is a laser diode (e.g., edge-emitting laser or VCSEL) or an LED, which emits light, or a photodiode or a sensor, which needs to be exposed for sensing. In the event that the second electrically-driven device 101 is a light emitting device, such as a VCSEL or an LED for example, in operation the second electrically-driven device 101 may emit a beam of light 104 through the opening on the second portion of the second silicon-based heat sink 102a as shown in FIGS. 1 and 3-6.

To provide electrical conduction between the first electrically-driven device 107 and the second electrically-driven device 101 so that the first electrically-driven device 107 can drive and/or control the second electrically-driven device 101, either or both of the second primary surface of the first silicon-based heat sink 103a and the first primary surface of the second silicon-based heat sink 102a may comprise one or more metallic patterns deposited thereon. Thus, when the first electrically-driven device 107 and the second electrically-driven device 101 are disposed, or sandwiched, between the first silicon-based heat sink 103a and the second silicon-based heat sink 102a, the first electrically-driven device 107 is operable to drive the second electrically-driven device 101 by providing electricity through the one or more metallic patterns.

The apparatus 1001a may further comprise a second non-silicon heat sink 105, which is disposed on the second primary surface of the second silicon-based heat sink 102a. The second non-silicon heat sink 105 may be metal-based and may be made of, for example, copper, copper-tungsten alloy, aluminum, iron or any suitable metallic material. The material of the second non-silicon heat sink 105 is chosen so that the thermal conductivity of the second non-silicon heat sink 105 is greater than the thermal conductivity of the second silicon-based heat sink 102a.

Depending on the application, the second portion of the second silicon-based heat sink 102a may include an opening 108, and a portion of the second non-silicon heat sink 105 aligned with the second portion of the second silicon-based heat sink 102a may also include an opening 109 such that at least a portion of a surface of the second electrically-driven device 101 facing the second silicon-based heat sink 102a is exposed through the opening 108 of the second silicon-based heat sink 102a and the opening 109 of the second non-silicon heat sink 105 when the second electrically-driven device 101 is disposed between the first silicon-based heat sink 103a and the second silicon-based heat sink 102a. This feature is useful when the second electrically-driven device 101 is a laser diode (e.g., edge-emitting laser or VCSEL) or an LED, which emits light, or a sensor such as a photodiode for example, which needs to be exposed for sensing. In the event that the second electrically-driven device 101 is a light emitting device, such as a VCSEL or an LED for example, in operation the second electrically-driven device 101 may emit a beam of light 104 through the opening 108 on the second portion of the second silicon-based heat sink 102a and the opening 109 of the second non-silicon heat sink 105 as shown in FIGS. 1 and 3-6.

The apparatus 1001a may further comprise the first electrically-driven device 107, disposed on the first portion of the second primary surface of the first silicon-based heat sink 103a, and the second electrically-driven device 101, disposed on the second portion of the second primary surface of the first silicon-based heat sink 103a. The second electrically-driven device 101 is electrically driven by the first electrically-driven device 107. The first electrically-driven device 107 may comprise a driver circuit. For example, the first electrically-driven device 107 may comprise a laser driver circuit or a radio frequency (RF) driver circuit. The second electrically-driven device 101 may comprise a laser diode or a sensor. For example, the second electrically-driven device 101 may comprise an edge-emitting laser, a VCSEL, or a photo-diode.

In another embodiment, the apparatus 1001a comprises the first silicon-based heat sink 103a and the second silicon-based heat sink 102a. The apparatus 1001a may additionally comprise the first non-silicon heat sink 106 on which the first silicon-based heat sink 103a is disposed. The apparatus 1001a may further comprise the second non-silicon heat sink 105, disposed on the second silicon-based heat sink 102a. Moreover, the apparatus 1001a may further comprise the first electrically-driven device 107 and the second electrically-driven device 101, both sandwiched between the first silicon-based heat sink 103a and the second silicon-based heat sink 102a. As each of these components has been described above, in the interest of brevity the detailed description of these components will not be repeated. However, each of the first silicon-based heat sink 103a and the second silicon-based heat sink 102a may different features in various embodiments. The description below pertains to some exemplary embodiments thereof.

FIGS. 7-10 illustrates a configuration 1002a of the first and second silicon-based heat sinks 103a and 102a in accordance with an embodiment of the present disclosure. The configuration 1002a is also shown in FIGS. 1-6. As shown in FIGS. 7-10, each of the first silicon-based heat sink 103a and the second silicon-based heat sink 102a includes a plurality of grooves.

The first silicon-based heat sink 103a includes a groove 29 on its second primary surface (i.e., the surface that faces and is in contact with the first and second electrically-driven devices 107 and 101) and grooves 30 and 31 on its first primary surface (i.e., the surface that faces and is in contact with the first non-silicon heat sink 106). The grooves 29, 30 and 31 are parallel to each other and do not overlap with respect to an axis that is vertical to the first and second primary surfaces of the first silicon-based heat sink 103a. In other words, the grooves 29, 30 and 31 are staggered, as shown in FIGS. 7-10, and do not create a through-hole opening that communicatively connect the first and second primary surfaces of the first silicon-based heat sink 103a.

At least one of the grooves 29, 30 and 31 may be a V-notch groove etched into the first silicon-based heat sink 103a, which may be a silicon plate made of single-crystal silicon for example. Each of the two sloped surfaces of the V-notch grooves 29, 30 and/or 31 may have an angle, e.g., 54.7 degrees or 35.3 degrees, as measured from the second primary surface (i.e., in the case of groove 29) or the first primary surface (i.e., in the case of grooves 30 and/or 31) of the first silicon-based heat sink 103a. The depth of each of the grooves 29, 30 and 31 is less than the thickness h2a of the first silicon-based heat sink 103a, thus leaving a distance between the bottom of the trench of each of the grooves 29, 30 and 31 and the primary surface of the first silicon-based heat sink 103a that is opposite to the primary surface on which the groove 29, 30 and 31 is etched (e.g., distance t2a in the case of grooves 30 and 31 as shown in FIG. 10).

Figure 7:
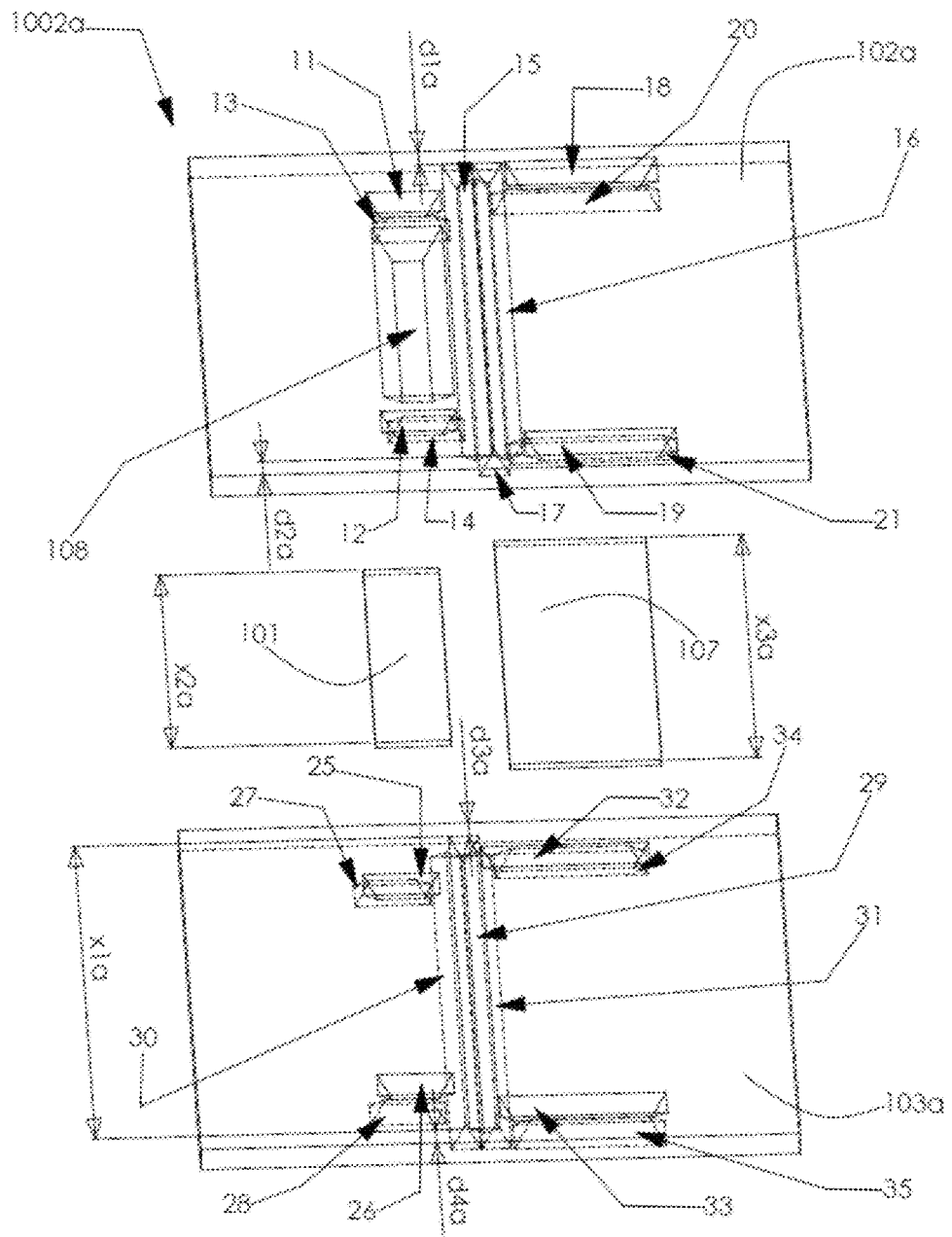
FIG. 7 is an exploded view of a configuration of silicon-based heat sinks of an apparatus in accordance with an embodiment of the present disclosure.
Figure 8:
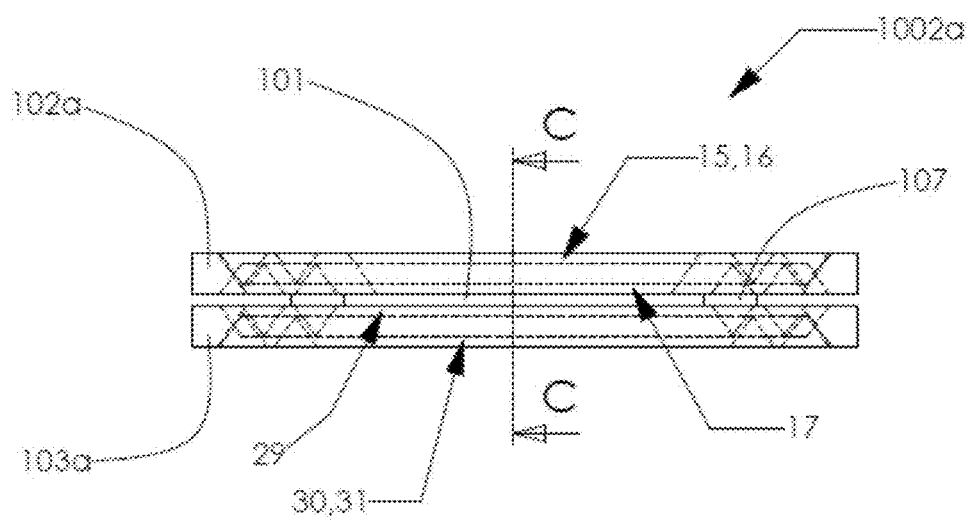
FIG. 8 is a first cross-sectional view of the apparatus of FIG. 7 in accordance with one embodiment of the present disclosure.
Figure 9:
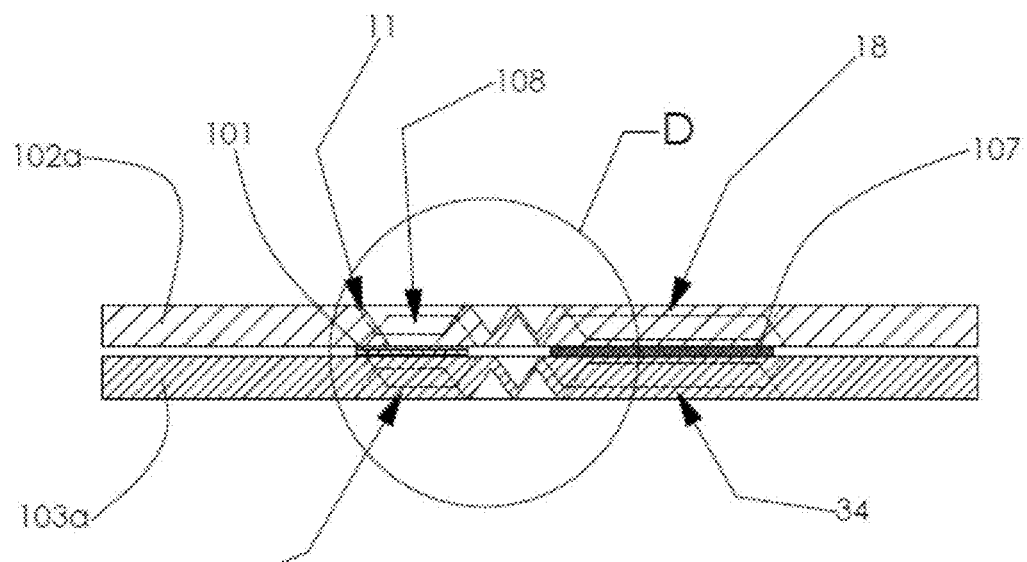
FIG. 9 is a second cross-sectional view of the apparatus of FIG. 7 in accordance with one embodiment of the present disclosure.

Each of the grooves 29, 30 and 31 may or may not respectively traverse the entire width of the first silicon-based heat sink 103a from a first primary edge (i.e., the edge that faces the reader) to a second primary edge (i.e., the edge that faces away from the reader) that is opposite to the first primary edge. In the example shown in FIGS. 7-10, the grooves 29, 30 and 31 do not traverse the entire width of the first silicon-based heat sink 103a. More specifically, one end of each of the grooves 29, 30 and 31 is a distance d4a from the first primary edge of the first silicon-based heat sink 103a while the other end of each of the grooves 29, 30 and 31 is a distance d3a from the first primary edge of the first silicon-based heat sink 103a. As shown in FIG. 7, each of the grooves 29, 30 and 31 has a length of x1a, which is less than a distance between the first primary edge and the second primary edge of the first silicon-based heat sink 103a. However, the length x1a of the grooves 29, 30 and 31 is longer than a length x3a of the first electrically-driven device 107 and a length x2a of the second electrically-driven device 101. The dimension x1a is greater than the dimensions x2a and x3a.

Figure 10:
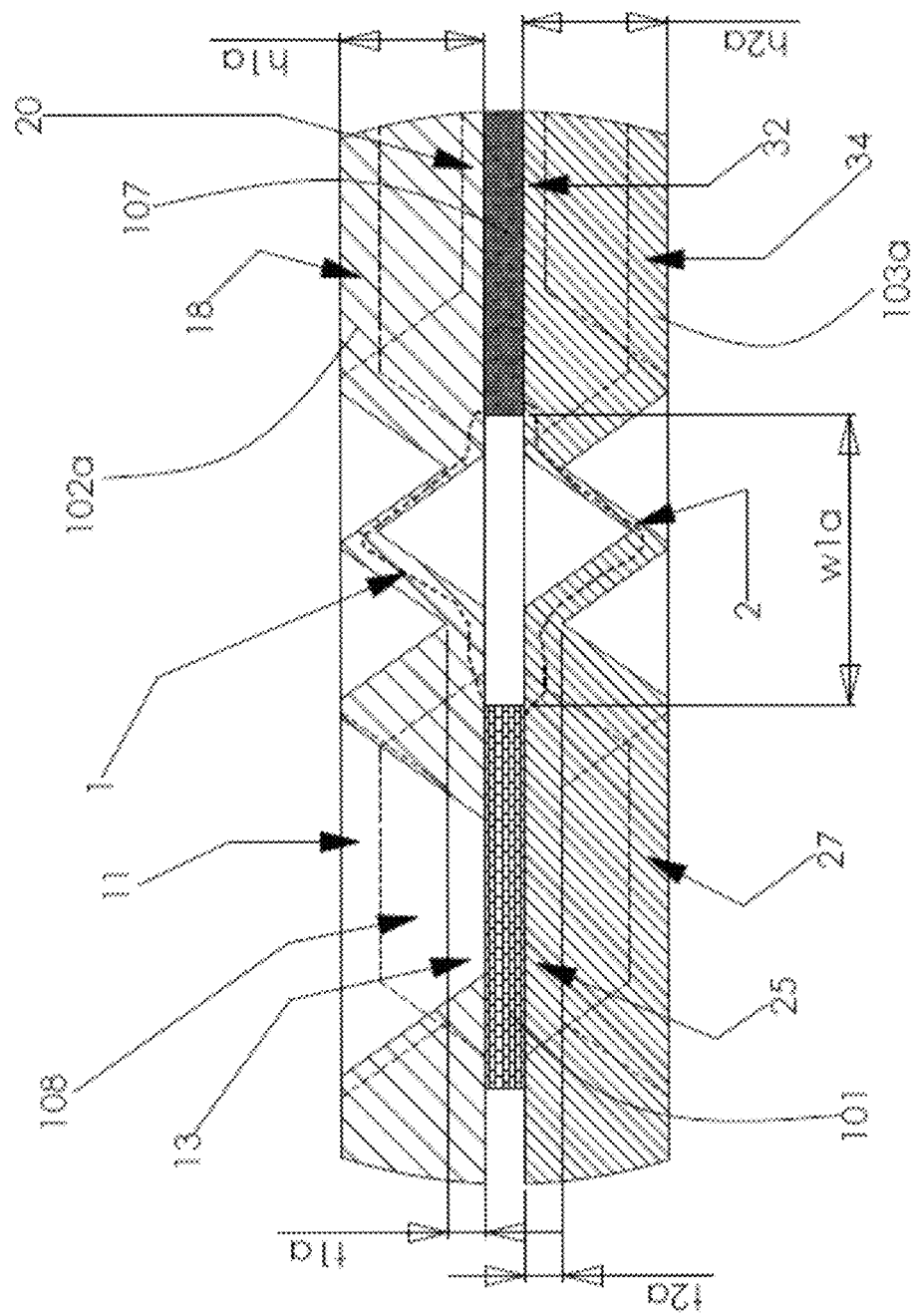
FIG. 10 is a magnified view of a portion of the apparatus as shown in FIG. 9 in accordance with one embodiment of the present disclosure.

The grooves 29, 30 and 31 are located between the first portion (i.e., the right half of the first silicon-based heat sink 103a as shown in FIGS. 7-10) and the second portion (i.e., the left half of the first silicon-based heat sink 103a as shown in FIGS. 7-10) of the first silicon-based heat sink 103a. This arrangement effectively increases the length of a heat conduction path 2 between the first electrically-driven device 107 and the second electrically-driven device 101 when these devices are disposed on the first silicon-based heat sink 103a, as shown in FIGS. 7-10. That is, the length of the heat conduction path 2 is longer, e.g., several times longer, than a respective heat conduction path from each of the first electrically-driven device 107 and the second electrically-driven device 101 to the first non-silicon heat sink 106 through the first silicon-based heat sink 103a, which would be the thickness h2a of the first silicon-based heat sink 103a. Similarly, the length of the heat conduction path 2 is longer than a straight line distance w1a between the first electrically-driven device 107 and the second electrically-driven device 101, as indicated in FIG. 10. This is because, due to the grooves 29, 30 and 31, any heat conduction path between the first electrically-driven device 107 and the second electrically-driven device 101 through the first silicon-based heat sink 103a needs to meander around the grooves 29, 30 and 31, whether traversing between groove 29 and grooves 30, 31 or traversing around either or both ends of the grooves 29, 30 and 31.

To further promote heat conduction from each of the first electrically-driven device 107 and the second electrically-driven device 101 to the first non-silicon heat sink 106 through the first silicon-based heat sink 103a by further increasing the length of heat conduction paths between the first electrically-driven device 107 and the second electrically-driven device 101, additional grooves and/or openings may be defined in the first silicon-based heat sink 103a. For example, as shown in FIGS. 7-10, the first silicon-based heat sink 103a further includes grooves 25, 26, 27, 28, 32, 33, 34 and 35. Grooves 25, 26, 32 and 33 are etched from the second primary surface of the first silicon-based heat sink 103a while grooves 27, 28, 34 and 35 are etched from the first primary surface of the first silicon-based heat sink 103a. Grooves 25, 26, 27 and 28 are located on the second portion of the first silicon-based heat sink 103a while grooves 32, 33, 34 and 35 are located on the first portion of the first silicon-based heat sink 103a. A straight line distance between the grooves 25 and 26 is longer than the length x2a of the second electrically-driven device 101. Similarly, a straight line distance between the grooves 27 and 28 is longer than the length x2a of the second electrically-driven device 101. A straight line distance between the grooves 32 and 33 is longer than the length x3a of the first electrically-driven device 107. Likewise, a straight line distance between the grooves 34 and 35 is longer than the length x3a of the first electrically-driven device 107.

At least one of the grooves 25, 26, 27, 28, 32, 33, 34 and 35 may be a V-notch groove etched into the first silicon-based heat sink 103a. Each of the two sloped surfaces of the V-notch grooves 25, 26, 27, 28, 32, 33, 34 and/or 35 may have an angle, e.g., 54.7 degrees or 35.3 degrees, as measured from the second primary surface (i.e., in the case of grooves 25, 26, 32 and/or 33) or the first primary surface (i.e., in the case of grooves 27, 28, 34 and/or 35) of the first silicon-based heat sink 103a. The depth of each of the grooves 25, 26, 27, 28, 32, 33, 34 and 35 is less than the thickness h2a of the first silicon-based heat sink 103a, thus leaving a distance between the bottom of the trench of each of the grooves 25, 26, 27, 28, 32, 33, 34 and 35 and the primary surface of the first silicon-based heat sink 103a that is opposite to the primary surface on which the groove 25, 26, 27, 28, 32, 33, 34 and 35 is etched (e.g., distance t2a in the case of groove 27 as shown in FIG. 10). In some embodiments, the dimension h2a may be in a range between 0.250 mm and 1.0 mm, the dimension w1a may be in a range between 0.300 mm and 10.0 mm, and the dimension t2a may be in a range between 0 and 0.80 mm. For example, in some embodiments, the dimension t2a may be in a range between 0 and 100 μm.

The second silicon-based heat sink 102a includes a groove 17 on its first primary surface (i.e., the surface that faces and is in contact with the first and second electrically-driven devices 107 and 101) and grooves 15 and 16 on its second primary surface (i.e., the surface that faces and is in contact with the second non-silicon heat sink 105). The grooves 15, 16 and 17 are parallel to each other and do not overlap with respect to an axis that is vertical to the first and second primary surfaces of the second silicon-based heat sink 102a. In other words, the grooves 15, 16 and 17 are staggered, as shown in FIGS. 7-10, and do not create a through-hole opening that communicatively connect the first and second primary surfaces of the second silicon-based heat sink 102a.

At least one of the grooves 15, 16 and 17 may be a V-notch groove etched into the second silicon-based heat sink 102a, which may be a silicon plate made of single-crystal silicon for example. Each of the two sloped surfaces of the V-notch grooves 15, 16 and/or 17 may have an angle, e.g., 54.7 degrees or 35.3 degrees, as measured from the first primary surface (i.e., in the case of groove 17) or the second primary surface (i.e., in the case of grooves 15 and/or 16) of the second silicon-based heat sink 102a. The depth of each of the grooves 15, 16 and 17 is less than the thickness h1a of the second silicon-based heat sink 102a, thus leaving a distance between the bottom of the trench of each of the grooves 15, 16 and 17 and the primary surface of the second silicon-based heat sink 102a that is opposite to the primary surface on which the groove 15, 16 and 17 is etched (e.g., distance t1a in the case of grooves 15 and 16 as shown in FIG. 10).

Each of the grooves 15, 16 and 17 may or may not respectively traverse the entire width of the second silicon-based heat sink 102a from a first primary edge (i.e., the edge that faces the reader) to a second primary edge (i.e., the edge that faces away from the reader) that is opposite to the first primary edge. In the example shown in FIGS. 7-10, the grooves 15, 16 and 17 do not traverse the entire width of the second silicon-based heat sink 102a. More specifically, one end of each of the grooves 15, 16 and 17 is a distance d2a from the first primary edge of the second silicon-based heat sink 102a while the other end of each of the grooves 15, 16 and 17 is a distance d1a from the first primary edge of the second silicon-based heat sink 102a. As shown in FIG. 7, the length of each of the grooves 15, 16 and 17 is longer than the length x3a of the first electrically-driven device 107 and the length x2a of the second electrically-driven device 101.

The grooves 15, 16 and 17 are located between the first portion (i.e., the right half of the second silicon-based heat sink 102a as shown in FIGS. 7-10) and the second portion (i.e., the left half of the second silicon-based heat sink 102a as shown in FIGS. 7-10) of the second silicon-based heat sink 102a. This arrangement effectively increases the length of a heat conduction path 1 between the first electrically-driven device 107 and the second electrically-driven device 101 when these devices are in contact with the second silicon-based heat sink 102a, as shown in FIG. 10. That is, the length of the heat conduction path 1 is longer, e.g., several times longer, than a respective heat conduction path from each of the first electrically-driven device 107 and the second electrically-driven device 101 to the second non-silicon heat sink 105 through the second silicon-based heat sink 102a, which would be the thickness h1a of the second silicon-based heat sink 102a. Similarly, the length of the heat conduction path 1 is longer than the straight line distance w1a between the first electrically-driven device 107 and the second electrically-driven device 101, as indicated in FIG. 10. This is because, due to the grooves 15, 16 and 17, any heat conduction path between the first electrically-driven device 107 and the second electrically-driven device 101 through the second silicon-based heat sink 102a needs to meander around the grooves 15, 16 and 17, whether traversing between groove 17 and grooves 15, 16 or traversing around either or both ends of the grooves 15, 16 and 17.

To further promote heat conduction from each of the first electrically-driven device 107 and the second electrically-driven device 101 to the second non-silicon heat sink 105 through the second silicon-based heat sink 102a by further increasing the length of heat conduction paths between the first electrically-driven device 107 and the second electrically-driven device 101, additional grooves and/or openings may be defined in the second silicon-based heat sink 102a. For example, as shown in FIGS. 7-10, the second silicon-based heat sink 102a further includes grooves 11, 12, 13, 14, 18, 19, 20 and 21. Grooves 11, 12, 18 and 19 are etched from the second primary surface of the second silicon-based heat sink 102a while grooves 13, 14, 20 and 21 are etched from the first primary surface of the second silicon-based heat sink 102a. Grooves 11, 12, 13 and 14 are located on the second portion of the second silicon-based heat sink 102a while grooves 18, 19, 20 and 21 are located on the first portion of the second silicon-based heat sink 102a. A straight line distance between the grooves 11 and 12 is longer than the length x2a of the second electrically-driven device 101. Similarly, a straight line distance between the grooves 13 and 14 is longer than the length x2a of the second electrically-driven device 101. A straight line distance between the grooves 18 and 19 is longer than the length x3a of the first electrically-driven device 107. Likewise, a straight line distance between the grooves 20 and 21 is longer than the length x3a of the first electrically-driven device 107.

At least one of the grooves 11, 12, 13, 14, 18, 19, 20 and 21 may be a V-notch groove etched into the second silicon-based heat sink 102a. Each of the two sloped surfaces of the V-notch grooves 11, 12, 13, 14, 18, 19, 20 and/or 21 may have an angle, e.g., 54.7 degrees or 35.3 degrees, as measured from the second primary surface (i.e., in the case of grooves 11, 12, 18 and/or 19) or the first primary surface (i.e., in the case of grooves 13, 14, 20 and/or 21) of the second silicon-based heat sink 102a. The depth of each of the grooves 11, 12, 13, 14, 18, 19, 20 and 21 is less than the thickness h1a of the second silicon-based heat sink 102a, thus leaving a distance between the bottom of the trench of each of the grooves 11, 12, 13, 14, 18, 19, 20 and 21 and the primary surface of the second silicon-based heat sink 102a that is opposite to the primary surface on which the groove 11, 12, 13, 14, 18, 19, 20 and 21 is etched (e.g., distance t1a in the case of grooves 11 and 12 as shown in FIG. 10). In some embodiments, the dimension h1a may be in a range between 0.250 mm and 1.0 mm, and the dimension t1a may be in a range between 0 and 0.80 mm. For example, in some embodiments, the dimension t1a may be in a range between 0 and 100 μm.

In the event that the second electrically-driven device 101 is a light emitting device, e.g., a VCSEL or LED, or a sensor, e.g., a photodiode, the second silicon-based heat sink 102a further includes an opening 108 that is aligned with the second electrically-driven device 101 to expose at least a portion of the surface of the second electrically-driven device 101 that faces the second silicon-based heat sink 102a. This allows the second electrically-driven device 101 to emit a beam of laser or light when it is a VCSEL or LED, respectively, or to sense light, temperature, pressure, moisture or whatever environmental factor(s) by a sensor in the second electrically-driven device 101 senses.

FIGS. 11-14 illustrate a configuration 1002b of first and second silicon-based heat sinks 103b and 102b in accordance with another embodiment of the present disclosure. As shown in FIGS. 7-10, each of the first silicon-based heat sink 103b and the second silicon-based heat sink 102b includes a plurality of grooves.

The first silicon-based heat sink 103b includes a groove 59 on its second primary surface (i.e., the surface that faces and is in contact with the first and second electrically-driven devices 107 and 101) and a groove 60 on its first primary surface (i.e., the surface that faces and is in contact with the first non-silicon heat sink 106). The grooves 59 and 60 are parallel to each other and overlap with respect to an axis that is vertical to the first and second primary surfaces of the first silicon-based heat sink 103b. In other words, the grooves 59 and 60 create a through-hole opening that communicatively connect the first and second primary surfaces of the first silicon-based heat sink 103b.

The grooves 59 and 60 are etched into the first silicon-based heat sink 103b, which may be a silicon plate made of single-crystal silicon for example. Each of the two sloped surfaces of the grooves 59 and 60 may have an angle, e.g., 54.7 degrees or 35.3 degrees, as measured from the second primary surface (i.e., in the case of groove 59) or the first primary surface (i.e., in the case of groove 60) of the first silicon-based heat sink 103b.

Figure 11:
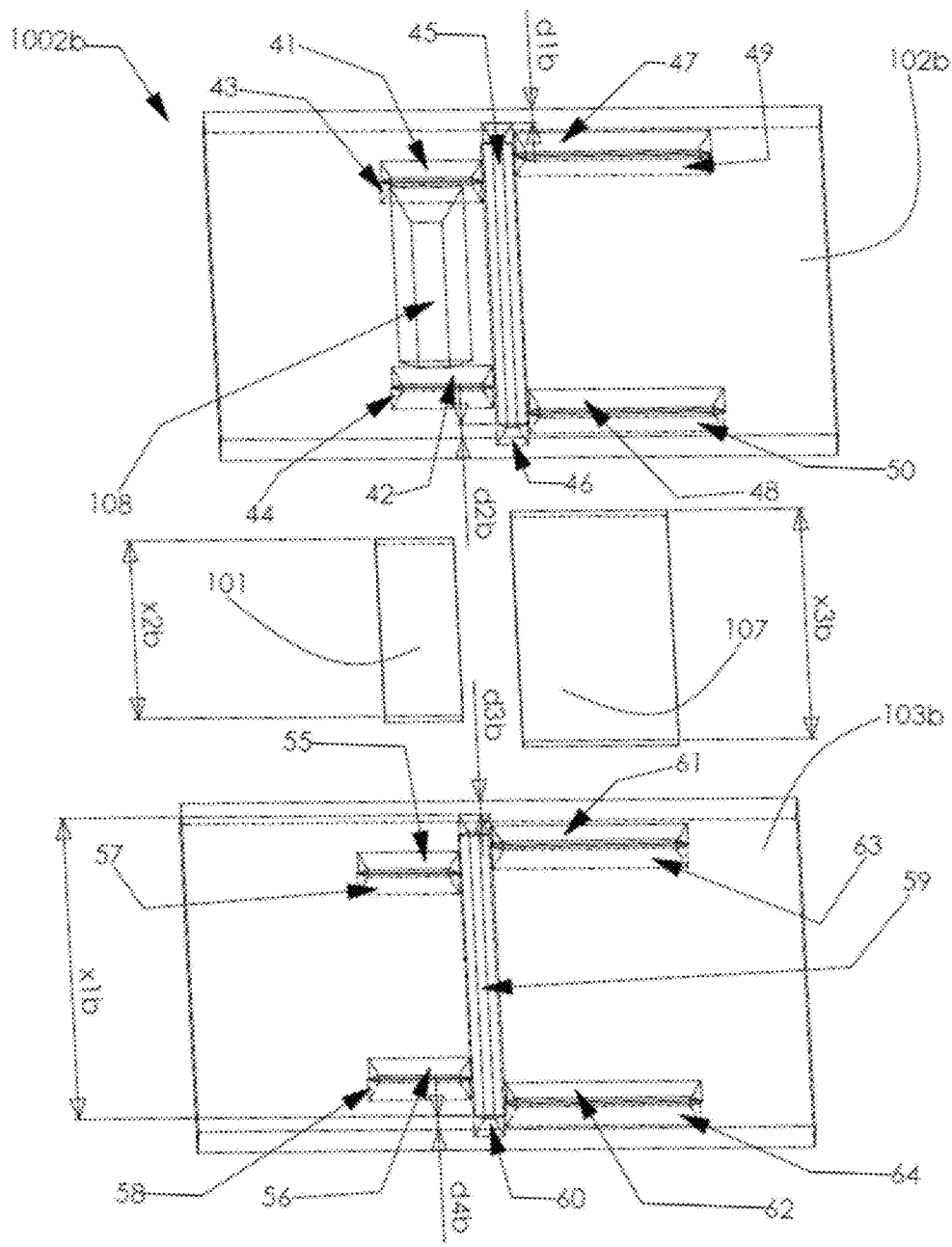
FIG. 11 is an exploded view of a configuration of silicon-based heat sinks of an apparatus in accordance with another embodiment of the present disclosure.
Figure 12:
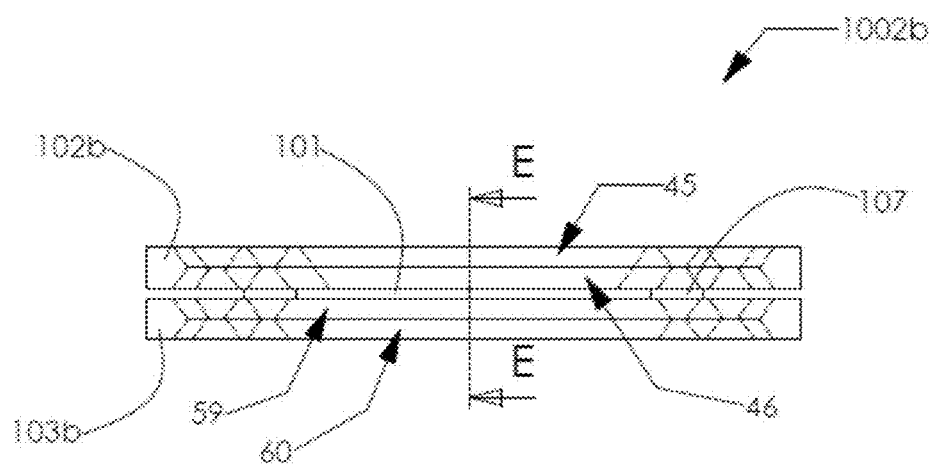
FIG. 12 is a first cross-sectional view of the apparatus of FIG. 11 in accordance with one embodiment of the present disclosure.
Figure 13:
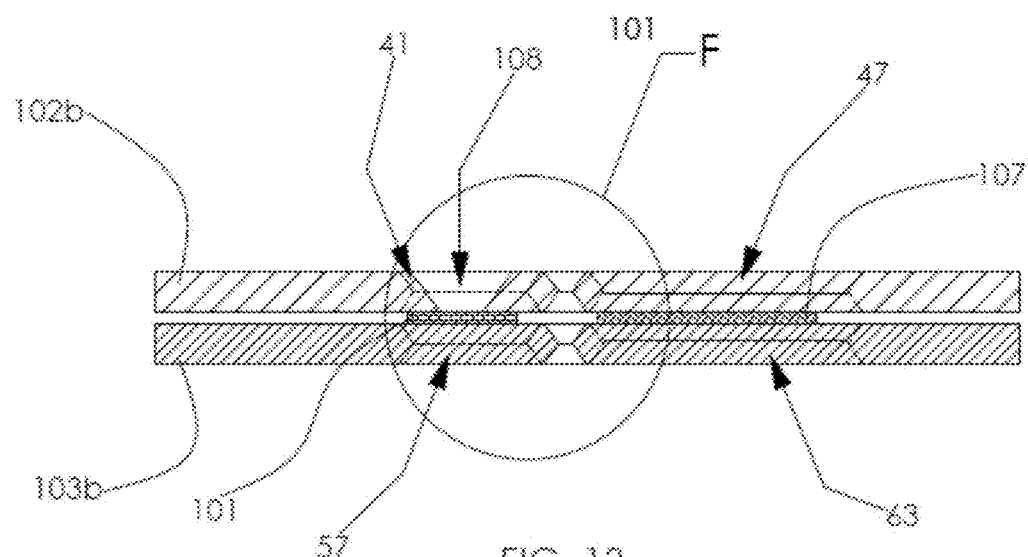
FIG. 13 is a second cross-sectional view of the apparatus of FIG. 11 in accordance with one embodiment of the present disclosure.

Each of the grooves 59 and 60 does not respectively traverse the entire width of the first silicon-based heat sink 103b from a first primary edge (i.e., the edge that faces the reader) to a second primary edge (i.e., the edge that faces away from the reader) that is opposite to the first primary edge. As shown in FIGS. 11-14, the grooves 59 and 60 do not traverse the entire width of the first silicon-based heat sink 103b. More specifically, one end of each of the grooves 59 and 60 is a distance d4b from the first primary edge of the first silicon-based heat sink 103b while the other end of each of the grooves 59 and 60 is a distance d3b from the first primary edge of the first silicon-based heat sink 103b. As shown in FIG. 11, each of the grooves 59 and 60 has a length of x1b, which is less than a distance between the first primary edge and the second primary edge of the first silicon-based heat sink 103b. However, the length x1b of the grooves 59 and 60 is longer than a length x3b of the first electrically-driven device 107 and a length x2b of the second electrically-driven device 101. The dimension x1b is greater than the dimensions x2b and x3b.

Figure 14:
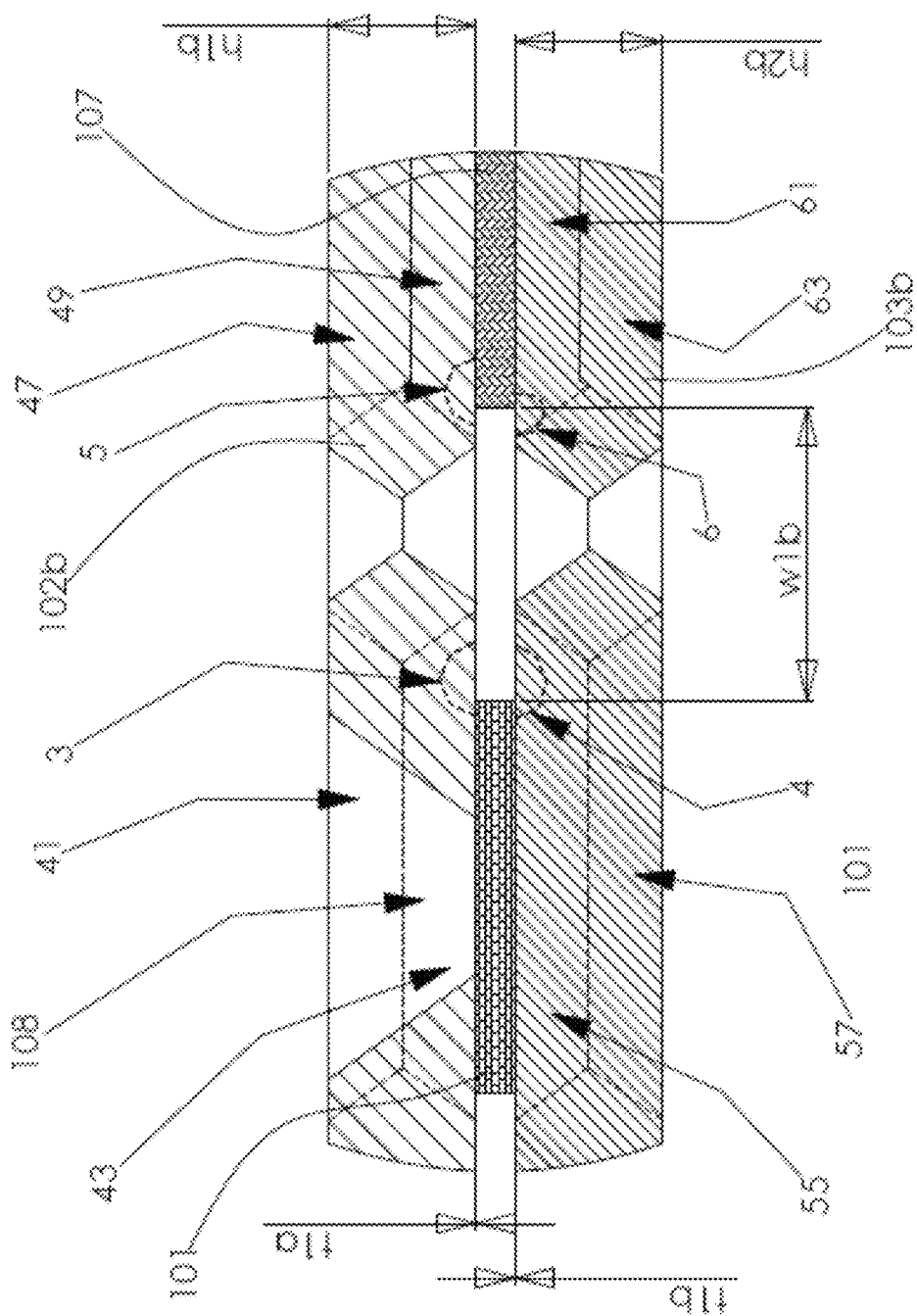
FIG. 14 is a magnified view of a portion of the apparatus as shown in FIG. 13 in accordance with one embodiment of the present disclosure.

The grooves 59 and 60 are located between the first portion (i.e., the right half of the first silicon-based heat sink 103b as shown in FIGS. 11-14) and the second portion (i.e., the left half of the first silicon-based heat sink 103b as shown in FIGS. 11-14) of the first silicon-based heat sink 103b. This arrangement effectively increases the length of heat conduction paths 4 and 6 between the first electrically-driven device 107 and the second electrically-driven device 101 when these devices are disposed on the first silicon-based heat sink 103b, as shown in FIGS. 11-14. That is, the length of each of the heat conduction paths 4 and 6 is longer, e.g., several times longer, than a respective heat conduction path from each of the first electrically-driven device 107 and the second electrically-driven device 101 to the first non-silicon heat sink 106 through the first silicon-based heat sink 103b, which would be the thickness h2b of the first silicon-based heat sink 103b. Similarly, the length of each of the heat conduction paths 4 and 6 is longer than a straight line distance w1b between the first electrically-driven device 107 and the second electrically-driven device 101, as indicated in FIG. 14. This is because, due to the grooves 59 and 60, any heat conduction path between the first electrically-driven device 107 and the second electrically-driven device 101 through the first silicon-based heat sink 103b needs to meander around the grooves 59 and 60 by traversing around either or both ends of the grooves 59 and 60.

To further promote heat conduction from each of the first electrically-driven device 107 and the second electrically-driven device 101 to the first non-silicon heat sink 106 through the first silicon-based heat sink 103b by further increasing the length of heat conduction paths between the first electrically-driven device 107 and the second electrically-driven device 101, additional grooves and/or openings may be defined in the first silicon-based heat sink 103b. For example, as shown in FIGS. 11-14, the first silicon-based heat sink 103b further includes grooves 55, 56, 57, 58, 61, 62, 63 and 64. Grooves 55, 56, 61 and 62 are etched from the second primary surface of the first silicon-based heat sink 103b while grooves 57, 58, 63 and 64 are etched from the first primary surface of the first silicon-based heat sink 103b. Grooves 55, 56, 57 and 58 are located on the second portion of the first silicon-based heat sink 103b while grooves 61, 62, 63 and 64 are located on the first portion of the first silicon-based heat sink 103b. A straight line distance between the grooves 55 and 56 is longer than the length x2b of the second electrically-driven device 101. Similarly, a straight line distance between the grooves 57 and 58 is longer than the length x2b of the second electrically-driven device 101. A straight line distance between the grooves 61 and 62 is longer than the length x3b of the first electrically-driven device 107. Likewise, a straight line distance between the grooves 63 and 64 is longer than the length x3b of the first electrically-driven device 107.

The grooves 55 and 57 are parallel to each other and overlap with respect to an axis that is vertical to the first and second primary surfaces of the first silicon-based heat sink 103b. In other words, the grooves 55 and 57 create a through-hole opening that communicatively connect the first and second primary surfaces of the first silicon-based heat sink 103b. The grooves 56 and 58 are parallel to each other and overlap with respect to an axis that is vertical to the first and second primary surfaces of the first silicon-based heat sink 103b. In other words, the grooves 56 and 58 create a through-hole opening that communicatively connect the first and second primary surfaces of the first silicon-based heat sink 103b. The grooves 61 and 63 are parallel to each other and overlap with respect to an axis that is vertical to the first and second primary surfaces of the first silicon-based heat sink 103b. In other words, the grooves 61 and 63 create a through-hole opening that communicatively connect the first and second primary surfaces of the first silicon-based heat sink 103b. The grooves 62 and 64 are parallel to each other and overlap with respect to an axis that is vertical to the first and second primary surfaces of the first silicon-based heat sink 103b. In other words, the grooves 62 and 64 create a through-hole opening that communicatively connect the first and second primary surfaces of the first silicon-based heat sink 103b.

The grooves 55, 56, 57, 58, 61, 62, 63 and 64 are etched into the first silicon-based heat sink 103b. Each of the two sloped surfaces of the 55, 56, 57, 58, 61, 62, 63 and 64 may have an angle, e.g., 54.7 degrees or 35.3 degrees, as measured from the second primary surface (i.e., in the case of grooves 55, 56, 61 and 62) or the first primary surface (i.e., in the case of grooves 57, 58, 63 and 64) of the first silicon-based heat sink 103b. In some embodiments, the dimension h2b may be in a range between 0.250 mm and 1.0 mm, the dimension w1b may be in a range between 0.300 mm and 10.0 mm, and the dimension t1b may be in a range between 0 and 0.80 mm. For example, in some embodiments, the dimension t1b may be in a range between 0 and 100 μm.

The second silicon-based heat sink 102b includes a groove 45 on its second primary surface (i.e., the surface that faces and is in contact with the first and second electrically-driven devices 107 and 101) and a groove 46 on its first primary surface (i.e., the surface that faces and is in contact with the first non-silicon heat sink 106). The grooves 45 and 46 are parallel to each other and overlap with respect to an axis that is vertical to the first and second primary surfaces of the second silicon-based heat sink 102b. In other words, the grooves 45 and 46 create a through-hole opening that communicatively connect the first and second primary surfaces of the second silicon-based heat sink 102b.

The grooves 45 and 46 are etched into the second silicon-based heat sink 102b, which may be a silicon plate made of single-crystal silicon for example. Each of the two sloped surfaces of the grooves 45 and 46 may have an angle, e.g., 54.7 degrees or 35.3 degrees, as measured from the second primary surface (i.e., in the case of groove 45) or the first primary surface (i.e., in the case of groove 46) of the second silicon-based heat sink 102b.

Each of the grooves 45 and 46 does not respectively traverse the entire width of the second silicon-based heat sink 102b from a first primary edge (i.e., the edge that faces the reader) to a second primary edge (i.e., the edge that faces away from the reader) that is opposite to the first primary edge. As shown in FIGS. 11-14, the grooves 45 and 46 do not traverse the entire width of the second silicon-based heat sink 102b. More specifically, one end of each of the grooves 45 and 46 is a distance d2b from the first primary edge of the second silicon-based heat sink 102b while the other end of each of the grooves 45 and 46 is a distance d1b from the first primary edge of the second silicon-based heat sink 102b. As shown in FIG. 11, each of the grooves 45 and 46 has a length that is less than a distance between the first primary edge and the second primary edge of the second silicon-based heat sink 102b. However, the length of the grooves 45 and 46 is longer than the length x3b of the first electrically-driven device 107 and the length x2b of the second electrically-driven device 101.

The grooves 45 and 46 are located between the first portion (i.e., the right half of the second silicon-based heat sink 102b as shown in FIGS. 11-14) and the second portion (i.e., the left half of the second silicon-based heat sink 102b as shown in FIGS. 11-14) of the second silicon-based heat sink 102b. This arrangement effectively increases the length of heat conduction paths 3 and 5 between the first electrically-driven device 107 and the second electrically-driven device 101 when these devices are in contact with the second silicon-based heat sink 102b, as shown in FIGS. 11-14. That is, the length of each of the heat conduction paths 3 and 5 is longer, e.g., several times longer, than a respective heat conduction path from each of the first electrically-driven device 107 and the second electrically-driven device 101 to the second non-silicon heat sink 105 through the second silicon-based heat sink 102b, which would be the thickness h1b of the second silicon-based heat sink 102b. Similarly, the length of each of the heat conduction paths 3 and 5 is longer than a straight line distance w1b between the first electrically-driven device 107 and the second electrically-driven device 101, as indicated in FIG. 14. This is because, due to the grooves 45 and 46, any heat conduction path between the first electrically-driven device 107 and the second electrically-driven device 101 through the second silicon-based heat sink 102b needs to meander around the grooves 45 and 46 by traversing around either or both ends of the grooves 45 and 46.

To further promote heat conduction from each of the first electrically-driven device 107 and the second electrically-driven device 101 to the second non-silicon heat sink 105 through the second silicon-based heat sink 102b by further increasing the length of heat conduction paths between the first electrically-driven device 107 and the second electrically-driven device 101, additional grooves and/or openings may be defined in the second silicon-based heat sink 102b. For example, as shown in FIGS. 11-14, the second silicon-based heat sink 102b further includes grooves 41, 42, 43, 44, 47, 48, 49 and 50. Grooves 41, 42, 47 and 48 are etched from the second primary surface of the second silicon-based heat sink 102b while grooves 43, 44, 49 and 50 are etched from the first primary surface of the second silicon-based heat sink 102b. Grooves 41, 42, 43 and 44 are located on the second portion of the second silicon-based heat sink 102b while grooves 47, 48, 49 and 50 are located on the first portion of the second silicon-based heat sink 102b. A straight line distance between the grooves 41 and 42 is longer than the length x2b of the second electrically-driven device 101. Similarly, a straight line distance between the grooves 43 and 44 is longer than the length x2b of the second electrically-driven device 101. A straight line distance between the grooves 47 and 48 is longer than the length x3b of the first electrically-driven device 107. Likewise, a straight line distance between the grooves 47 and 48 is longer than the length x3b of the first electrically-driven device 107.

The grooves 41 and 43 are parallel to each other and overlap with respect to an axis that is vertical to the first and second primary surfaces of the second silicon-based heat sink 102b. In other words, the grooves 41 and 43 create a through-hole opening that communicatively connect the first and second primary surfaces of the second silicon-based heat sink 102b. The grooves 42 and 44 are parallel to each other and overlap with respect to an axis that is vertical to the first and second primary surfaces of the second silicon-based heat sink 102b. In other words, the grooves 42 and 44 create a through-hole opening that communicatively connect the first and second primary surfaces of the second silicon-based heat sink 102b. The grooves 47 and 49 are parallel to each other and overlap with respect to an axis that is vertical to the first and second primary surfaces of the second silicon-based heat sink 102b. In other words, the grooves 47 and 49 create a through-hole opening that communicatively connect the first and second primary surfaces of the second silicon-based heat sink 102b. The grooves 48 and 50 are parallel to each other and overlap with respect to an axis that is vertical to the first and second primary surfaces of the second silicon-based heat sink 102b. In other words, the grooves 48 and 50 create a through-hole opening that communicatively connect the first and second primary surfaces of the second silicon-based heat sink 102b.

The grooves 41, 42, 43, 44, 47, 48, 49 and 50 are etched into the second silicon-based heat sink 102b. Each of the two sloped surfaces of the 41, 42, 43, 44, 47, 48, 49 and 50 may have an angle, e.g., 54.7 degrees or 35.3 degrees, as measured from the second primary surface (i.e., in the case of grooves 41, 42, 47 and 48) or the first primary surface (i.e., in the case of grooves 43, 44, 49 and 50) of the second silicon-based heat sink 102b. In some embodiments, the dimension h1b may be in a range between 0.250 mm and 1.0 mm, and the dimension t1a may be in a range between 0 and 0.80 mm. For example, in some embodiments, the dimension t1a may be in a range between 0 and 100 μm.

In the event that the second electrically-driven device 101 is a light emitting device, e.g., a VCSEL or LED, or a sensor, e.g., a photodiode, the second silicon-based heat sink 102b further includes an opening 108 that is aligned with the second electrically-driven device 101 to expose at least a portion of the surface of the second electrically-driven device 101 that faces the second silicon-based heat sink 102b. This allows the second electrically-driven device 101 to emit a beam of laser or light when it is a VCSEL or LED, respectively, or to sense light, temperature, pressure, moisture or whatever environmental factor(s) by a sensor in the second electrically-driven device 101 senses.

FIGS. 15-18 illustrate a configuration 1002c of first and second silicon-based heat sinks 103c and 102c in accordance with a further embodiment of the present disclosure. As shown in FIGS. 15-18, each of the first silicon-based heat sink 103c and the second silicon-based heat sink 102c includes a plurality of grooves.

The first silicon-based heat sink 103c includes a groove 89 on its first primary surface (i.e., the surface that faces and is in contact with the first non-silicon heat sink 106). The groove 89 may be a V-notch groove etched into the first silicon-based heat sink 103c, which may be a silicon plate made of single-crystal silicon for example. Each of the two sloped surfaces of the V-notch groove 89 may have an angle, e.g., 54.7 degrees or 35.3 degrees, as measured from the first primary surface of the first silicon-based heat sink 103c. The depth of each of the groove 89 is less than the thickness h2c of the first silicon-based heat sink 103c, thus leaving a distance between the bottom of the trench of the groove 89 and the second primary surface of the first silicon-based heat sink 103c (e.g., distance t2c as shown in FIG. 18).

Figure 15:
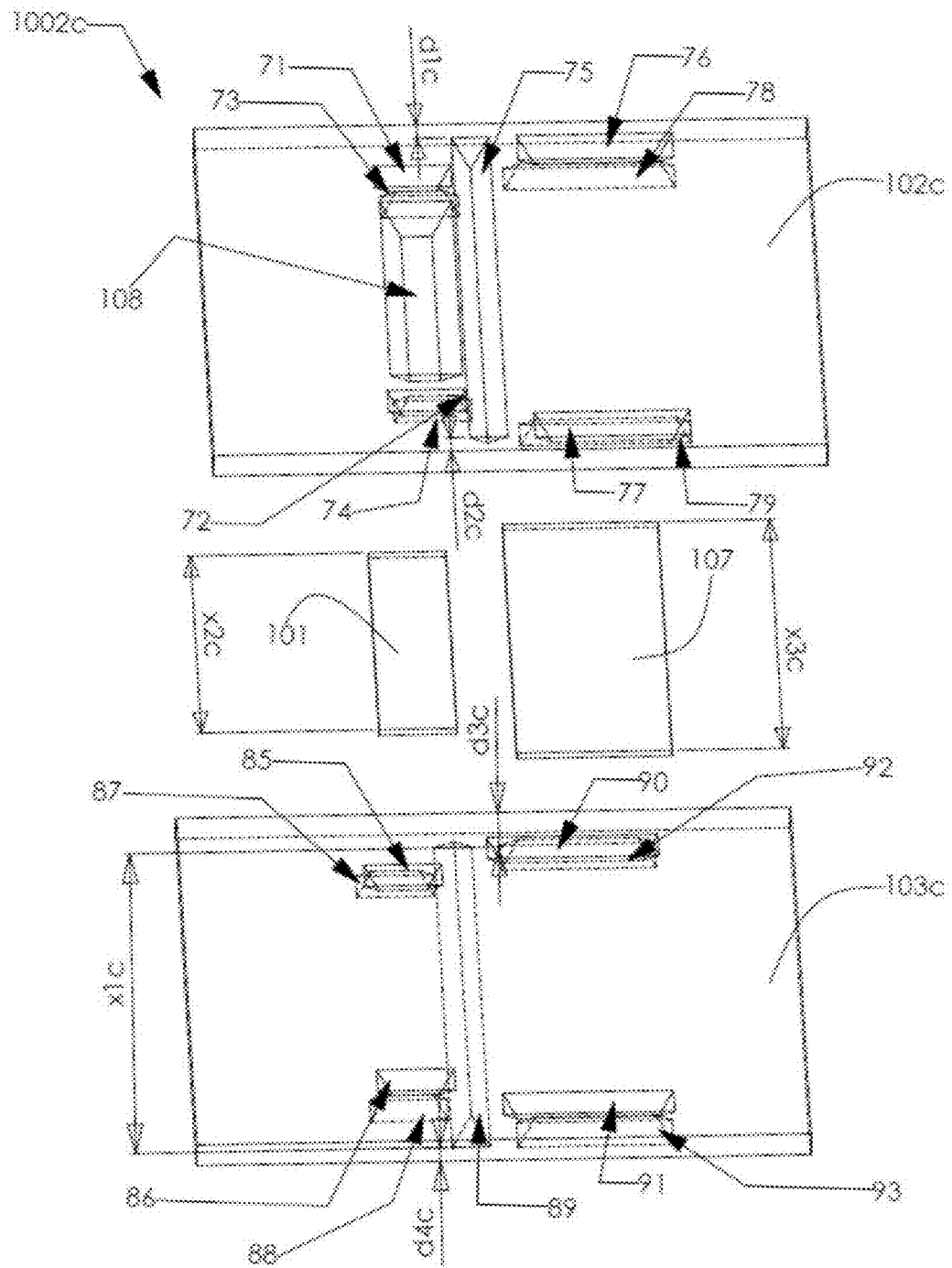
FIG. 15 is an exploded view of a configuration of silicon-based heat sinks of an apparatus in accordance with a further embodiment of the present disclosure.
Figure 16:
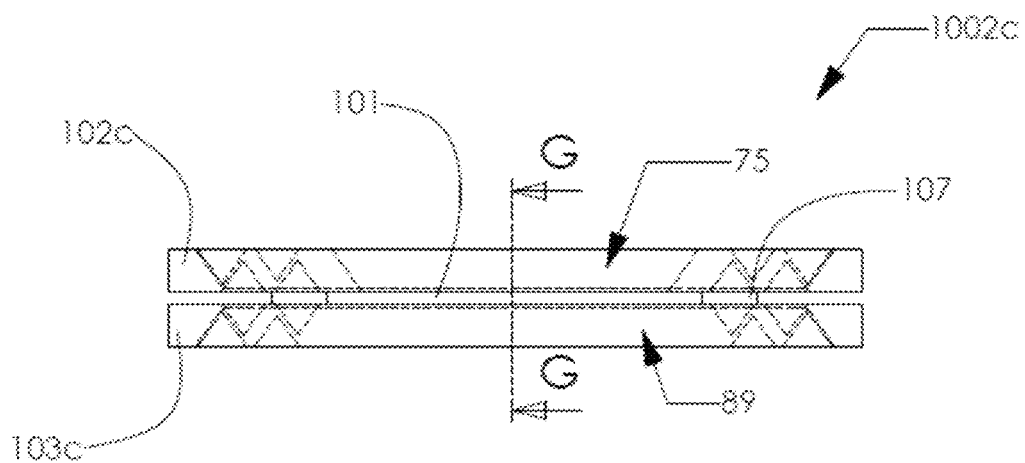
FIG. 16 is a first cross-sectional view of the apparatus of FIG. 15 in accordance with one embodiment of the present disclosure.
Figure 17:
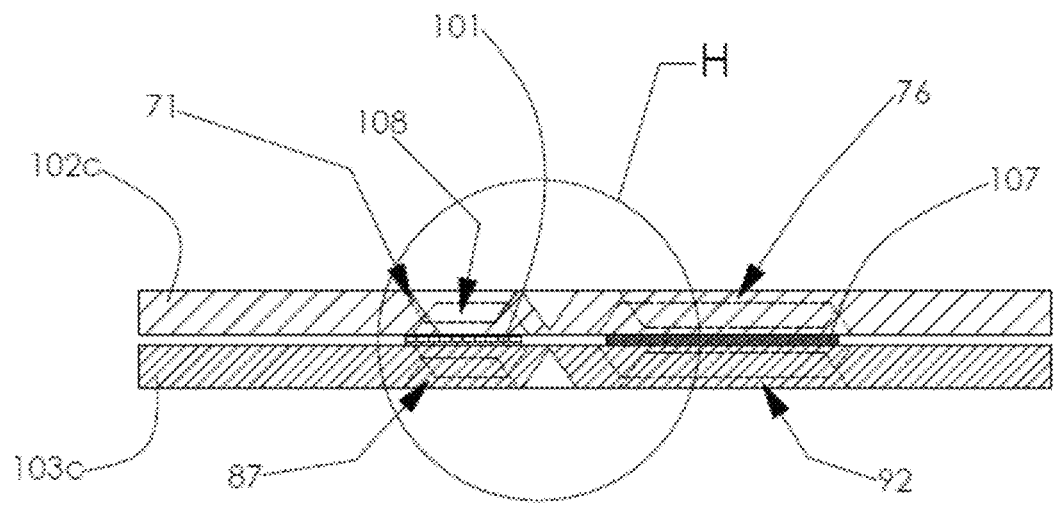
FIG. 17 is a second cross-sectional view of the apparatus of FIG. 15 in accordance with one embodiment of the present disclosure.

The groove 89 may or may not traverse the entire width of the first silicon-based heat sink 103c from a first primary edge (i.e., the edge that faces the reader) to a second primary edge (i.e., the edge that faces away from the reader) that is opposite to the first primary edge. In the example shown in FIGS. 15-18, the groove 89 does not traverse the entire width of the first silicon-based heat sink 103c. More specifically, one end of the groove 89 is a distance d4c from the first primary edge of the first silicon-based heat sink 103c while the other end of the groove 89 is a distance d3c from the first primary edge of the first silicon-based heat sink 103c. As shown in FIG. 15, the groove 89 has a length of x1c, which is less than a distance between the first primary edge and the second primary edge of the first silicon-based heat sink 103c. However, the length x1c of the groove 89 is longer than a length x3c of the first electrically-driven device 107 and a length x2c of the second electrically-driven device 101. The dimension x1c is greater than the dimensions x2c and x3c.

Figure 18:
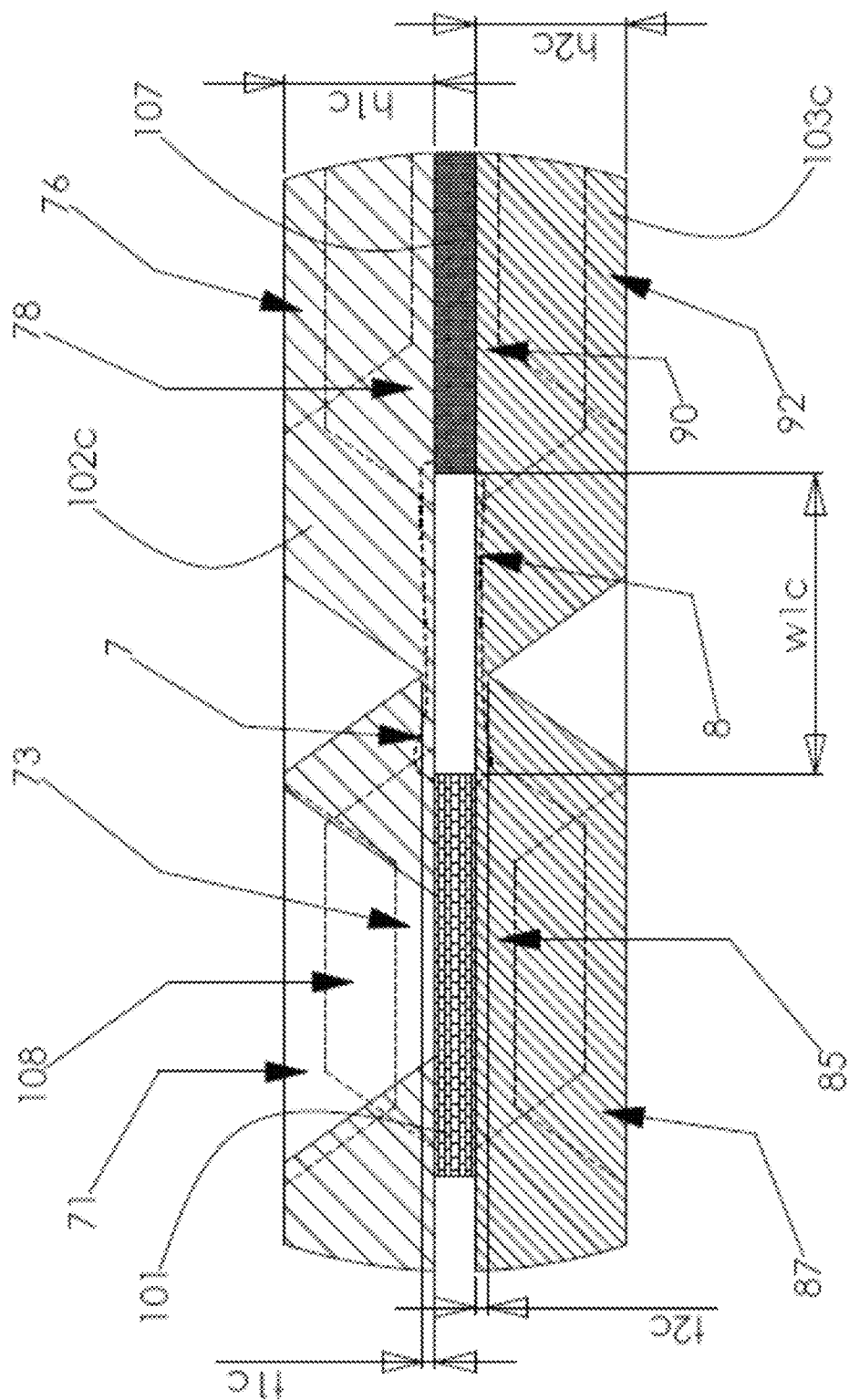
FIG. 18 is a magnified view of a portion of the apparatus as shown in FIG. 17 in accordance with one embodiment of the present disclosure.

The groove 89 is located between the first portion (i.e., the right half of the first silicon-based heat sink 103c as shown in FIGS. 15-18) and the second portion (i.e., the left half of the first silicon-based heat sink 103c as shown in FIGS. 15-18) of the first silicon-based heat sink 103c. This arrangement effectively increases the length of a heat conduction path 8 between the first electrically-driven device 107 and the second electrically-driven device 101 when these devices are disposed on the first silicon-based heat sink 103c, as shown in FIGS. 15-18. That is, the length of the heat conduction path 8 is longer, e.g., several times longer, than a respective heat conduction path from each of the first electrically-driven device 107 and the second electrically-driven device 101 to the first non-silicon heat sink 106 through the first silicon-based heat sink 103c, which would be the thickness h2c of the first silicon-based heat sink 103c. Similarly, the length of the heat conduction path 8 is longer than a straight line distance w1c between the first electrically-driven device 107 and the second electrically-driven device 101, as indicated in FIG. 18. This is because, due to the groove 89, any heat conduction path between the first electrically-driven device 107 and the second electrically-driven device 101 through the first silicon-based heat sink 103c needs to meander around the groove 89, whether traversing between groove 89 and the second primary surface of the first silicon-based heat sink 103c or traversing around either or both ends of the groove 89.

embodiments, the groove 89 is made in a deep groove so that the cross section of the first silicon-based heat sink 103c at the tip of the groove 89 is so thin, i.e., with only a thickness of t2c between the tip of the groove 89 and the second primary surface of the first silicon-based heat sink 103c, such that not very much heat will flow through the small cross section. That is, the small dimension of t2c in the direct-line heat conduction path between the first electrically-driven device 107 and the second electrically-driven device 101 is so small such that the heat flow is effectively choked off.

The distance w1c between the first electrically-driven device 107 and the second electrically-driven device 101 can be very close, but the small cross section will prevent thermal coupling between the first electrically-driven device 107 and the second electrically-driven device 101, e.g., from the first electrically-driven device 107 to the second electrically-driven device 101 or vice versa. Although it may be simple to separate the first electrically-driven device 107 and the second electrically-driven device 101, doing so would increase cost since the size of the first silicon-based heat sink 103c would need to be increased. The ideal situation is to package the first electrically-driven device 107 and the second electrically-driven device 101 in close proximity with the ability to redirect the heat from the first electrically-driven device 107 and the second electrically-driven device 101 to the first non-silicon heat sink 106 as a result of the groove 89.

To further promote heat conduction from each of the first electrically-driven device 107 and the second electrically-driven device 101 to the first non-silicon heat sink 106 through the first silicon-based heat sink 103c by further increasing the length of heat conduction paths between the first electrically-driven device 107 and the second electrically-driven device 101, additional grooves and/or openings may be defined in the first silicon-based heat sink 103c. For example, as shown in FIGS. 15-18, the first silicon-based heat sink 103c further includes grooves 85, 86, 87, 88, 90, 91, 92 and 93. Grooves 85, 86, 90 and 91 are etched from the second primary surface of the first silicon-based heat sink 103c while grooves 87, 88, 92 and 93 are etched from the first primary surface of the first silicon-based heat sink 103c. Grooves 85, 86, 87 and 88 are located on the second portion of the first silicon-based heat sink 103c while grooves 90, 91, 92 and 93 are located on the first portion of the first silicon-based heat sink 103c. A straight line distance between the grooves 85 and 86 is longer than the length x2c of the second electrically-driven device 101. Similarly, a straight line distance between the grooves 87 and 88 is longer than the length x2c of the second electrically-driven device 101. A straight line distance between the grooves 90 and 91 is longer than the length x3c of the first electrically-driven device 107. Likewise, a straight line distance between the grooves 92 and 93 is longer than the length x3c of the first electrically-driven device 107.

At least one of the grooves 85, 86, 87, 88, 90, 91, 92 and 93 may be a V-notch groove etched into the first silicon-based heat sink 103c. Each of the two sloped surfaces of the V-notch grooves 85, 86, 87, 88, 90, 91, 92 and/or 93 may have an angle, e.g., 54.7 degrees or 35.3 degrees, as measured from the second primary surface (i.e., in the case of grooves 85, 86, 90 and/or 91) or the first primary surface (i.e., in the case of grooves 87, 88, 92 and/or 93) of the first silicon-based heat sink 103c. The depth of each of the grooves 85, 86, 87, 88, 90, 91, 92 and 93 is less than the thickness h2c of the first silicon-based heat sink 103c, thus leaving a distance between the bottom of the trench of each of the grooves 85, 86, 87, 88, 90, 91, 92 and 93 and the primary surface of the first silicon-based heat sink 103c that is opposite to the primary surface on which the groove 85, 86, 87, 88, 90, 91, 92 and 93 is etched. In some embodiments, the dimension h2c may be in a range between 0.250 mm and 1.0 mm, the dimension w1c may be in a range between 0.300 mm and 10.0 mm, and the dimension t2c may be in a range between 0 and 0.80 mm. For example, in some embodiments, the dimension t2c may be in a range between 0 and 100 μm.

The second silicon-based heat sink 102c includes a groove 75 on its second primary surface (i.e., the surface that faces and is in contact with the second non-silicon heat sink 105). The groove 75 may be a V-notch groove etched into the second silicon-based heat sink 102c, which may be a silicon plate made of single-crystal silicon for example. Each of the two sloped surfaces of the V-notch 75 may have an angle, e.g., 54.7 degrees or 35.3 degrees, as measured from the second primary surface of the second silicon-based heat sink 102c. The depth of each of the groove 75 is less than the thickness h1c of the second silicon-based heat sink 102c, thus leaving a distance between the bottom of the trench of the groove 75 and the first primary surface of the second silicon-based heat sink 102c (e.g., distance t1c as shown in FIG. 18).

The groove 75 may or may not traverse the entire width of the second silicon-based heat sink 102c from a first primary edge (i.e., the edge that faces the reader) to a second primary edge (i.e., the edge that faces away from the reader) that is opposite to the first primary edge. In the example shown in FIGS. 15-18, the groove 75 does not traverse the entire width of the second silicon-based heat sink 102c. More specifically, one end of the groove 75 is a distance d2c from the first primary edge of the second silicon-based heat sink 102c while the other end of the groove 75 is a distance d1c from the first primary edge of the second silicon-based heat sink 102c. As shown in FIG. 15, the length of the groove 75 is longer than the length x3c of the first electrically-driven device 107 and the length x2c of the second electrically-driven device 101.

The groove 75 is located between the first portion (i.e., the right half of the second silicon-based heat sink 102c as shown in FIGS. 15-18) and the second portion (i.e., the left half of the second silicon-based heat sink 102c as shown in FIGS. 15-18) of the second silicon-based heat sink 102c. This arrangement effectively increases the length of a heat conduction path 7 between the first electrically-driven device 107 and the second electrically-driven device 101 when these devices are in contact with the second silicon-based heat sink 102c, as shown in FIG. 18. That is, the length of the heat conduction path 7 is longer, e.g., several times longer, than a respective heat conduction path from each of the first electrically-driven device 107 and the second electrically-driven device 101 to the second non-silicon heat sink 105 through the second silicon-based heat sink 102c, which would be the thickness h1c of the second silicon-based heat sink 102c. Similarly, the length of the heat conduction path 7 is longer than the straight line distance w1c between the first electrically-driven device 107 and the second electrically-driven device 101, as indicated in FIG. 18. This is because, due to the groove 75, any heat conduction path between the first electrically-driven device 107 and the second electrically-driven device 101 through the second silicon-based heat sink 102c needs to meander around the groove 75, whether traversing between groove 75 and the first primary surface of the second silicon-based heat sink 102c or traversing around either or both ends of the groove 75.

In some embodiments, the groove 75 is made in a deep groove so that the cross section of the second silicon-based heat sink 102c at the tip of the groove 75 is so thin, i.e., with only a thickness of t1c between the tip of the groove 75 and the first primary surface of the second silicon-based heat sink 102c, such that not very much heat will flow through the small cross section. That is, the small dimension of t1c in the direct-line heat conduction path between the first electrically-driven device 107 and the second electrically-driven device 101 is so small such that the heat flow is effectively choked off.

The distance w1c between the first electrically-driven device 107 and the second electrically-driven device 101 can be very close, but the small cross section will prevent thermal coupling between the first electrically-driven device 107 and the second electrically-driven device 101, e.g., from the first electrically-driven device 107 to the second electrically-driven device 101 or vice versa. Although it may be simple to separate the first electrically-driven device 107 and the second electrically-driven device 101, doing so would increase cost since the size of the second silicon-based heat sink 102c would need to be increased. The ideal situation is to package the first electrically-driven device 107 and the second electrically-driven device 101 in close proximity with the ability to redirect the heat from the first electrically-driven device 107 and the second electrically-driven device 101 to the second non-silicon heat sink 105 as a result of the groove 75.

To further promote heat conduction from each of the first electrically-driven device 107 and the second electrically-driven device 101 to the second non-silicon heat sink 105 through the second silicon-based heat sink 102c by further increasing the length of heat conduction paths between the first electrically-driven device 107 and the second electrically-driven device 101, additional grooves and/or openings may be defined in the second silicon-based heat sink 102c. For example, as shown in FIGS. 15-18, the second silicon-based heat sink 102c further includes grooves 71, 72, 73, 74, 76, 77, 78 and 79. Grooves 71, 72, 76 and 77 are etched from the second primary surface of the second silicon-based heat sink 102c while grooves 73, 74, 78 and 79 are etched from the first primary surface of the second silicon-based heat sink 102c. Grooves 71, 72, 73 and 74 are located on the second portion of the second silicon-based heat sink 102c while grooves 76, 77, 78 and 79 are located on the first portion of the second silicon-based heat sink 102c. A straight line distance between the grooves 71 and 72 is longer than the length x2c of the second electrically-driven device 101. Similarly, a straight line distance between the grooves 73 and 74 is longer than the length x2c of the second electrically-driven device 101. A straight line distance between the grooves 76 and 77 is longer than the length x3c of the first electrically-driven device 107. Likewise, a straight line distance between the grooves 78 and 79 is longer than the length x3c of the first electrically-driven device 107.

At least one of the grooves 71, 72, 73, 74, 76, 77, 78 and 79 may be a V-notch groove etched into the second silicon-based heat sink 102c. Each of the two sloped surfaces of the V-notch grooves 71, 72, 73, 74, 76, 77, 78 and/or 79 may have an angle, e.g., 54.7 degrees or 35.3 degrees, as measured from the second primary surface (i.e., in the case of grooves 71, 72, 76 and/or 77) or the first primary surface (i.e., in the case of grooves 73, 74, 78 and/or 79) of the second silicon-based heat sink 102c. The depth of each of the grooves 71, 72, 73, 74, 76, 77, 78 and 79 is less than the thickness h1c of the second silicon-based heat sink 102c, thus leaving a distance between the bottom of the trench of each of the grooves 71, 72, 73, 74, 76, 77, 78 and 79 and the primary surface of the second silicon-based heat sink 102c that is opposite to the primary surface on which the groove 71, 72, 73, 74, 76, 77, 78 and 79 is etched. In some embodiments, the dimension h1c may be in a range between 0.250 mm and 1.0 mm, and the dimension t1c may be in a range between 0 and 0.80 mm. For example, in some embodiments, the dimension t1c may be in a range between 0 and 100 μm.

In the event that the second electrically-driven device 101 is a light emitting device, e.g., a VCSEL or LED, or a sensor, e.g., a photodiode, the second silicon-based heat sink 102c further includes an opening 108 that is aligned with the second electrically-driven device 101 to expose at least a portion of the surface of the second electrically-driven device 101 that faces the second silicon-based heat sink 102c. This allows the second electrically-driven device 101 to emit a beam of laser or light when it is a VCSEL or LED, respectively, or to sense light, temperature, pressure, moisture or whatever environmental factor(s) by a sensor in the second electrically-driven device 101 senses.

CONCLUSION

The above-described embodiments and techniques pertain to an apparatus that simultaneously cools and thermally decouples electrically-driven devices that are in close proximity. Although the techniques have been described in language specific to certain applications, it is to be understood that the appended claims are not necessarily limited to the specific features or applications described herein. Rather, the specific features and applications are disclosed as exemplary forms of implementing such techniques. For instance, although the techniques have been described in the context of cooling and thermally decoupling a VCSEL and its driver circuit that are in close proximity, the techniques may be applied for cooling and thermally decoupling different electrically-driven devices in close proximity. Further, although the techniques have been described in the context of cooling and thermally decoupling two electrically-driven devices in close proximity, the techniques may be applied for cooling and thermally decoupling more than two (e.g., four, six, eight, etc.) electrically-driven devices in close proximity.

What is claimed is:

1. An apparatus, comprising:
   a first silicon-based heat sink configured to be disposed on a first non-silicon heat sink, the first silicon-based heat sink configured to receive a first electrically-driven device on a first portion of the first silicon-based heat sink and further configured to receive a second electrically-driven device on a second portion of the first silicon-based heat sink, the first silicon-based heat sink comprising a first groove or a first opening between the first portion and the second portion such that a heat conduction path between the first electrically-driven device and the first non-silicon heat sink through the first silicon-based heat sink is shorter than a heat conduction path between the first electrically-driven device and the second electrically-driven device through the first silicon-based heat sink; and
   a second silicon-based heat sink configured to be disposed on the first electrically-driven device and the second electrically-driven device such that the first silicon-based heat sink and the second silicon-based heat sink sandwich the first electrically-driven device and the second electrically-driven device therebetween with a first portion of the second silicon-based heat sink in contact with the first electrically-driven device and a second portion of the second silicon-based heat sink in contact with the second electrically-driven device, the second silicon-based heat sink comprising a second groove or a second opening between the first portion and the second portion of the second silicon-based heat sink.

2. The apparatus as recited in claim 1, wherein at least one of the first silicon-based heat sink or the second silicon-based heat sink comprises a silicon-based plate made of single-crystal silicon.

3. The apparatus as recited in claim 1, wherein at least one of the first silicon-based heat sink or the second silicon-based heat sink further comprises one or more additional grooves or one or more additional openings that increase the heat conduction path between the first electrically-driven device and the second electrically-driven device through the at least one of the first silicon-based heat sink or the second silicon-based heat sink having the one or more additional grooves or the one or more additional openings.

4. The apparatus of claim 1, wherein the first silicon-based heat sink comprises a first primary surface and a second primary surface opposite to the first primary surface, wherein the first primary surface of the first silicon-based heat sink is configured to be disposed on the first non-silicon heat sink, wherein the first and second electrically-driven devices are disposed on the second primary surface of the first silicon-based heat sink, wherein the second silicon-based heat sink comprises a first primary surface and a second primary surface opposite to the first primary surface, and wherein the first primary surface of the second silicon-based heat sink is in contact with the first and second electrically-driven devices.

5. The apparatus as recited in claim 4, wherein either or both of the second primary surface of the first silicon-based heat sink and the first primary surface of the second silicon-based heat sink comprise one or more metallic patterns deposited thereon such that the first electrically-driven device is operable to drive the second electrically-driven device by providing electricity through the one or more metallic patterns when the first electrically-driven device and the second electrically-driven device are disposed between the first silicon-based heat sink and the second silicon-based heat sink.

6. The apparatus as recited in claim 1, wherein the second portion of the second silicon-based heat sink comprises at least one additional opening that at least partially exposes a surface of the second electrically-driven device facing the second silicon-based heat sink when the second electrically-driven device is disposed between the first silicon-based heat sink and the second silicon-based heat sink.

7. The apparatus as recited in claim 1, further comprising:
   the first non-silicon heat sink on which the first silicon-based heat sink is disposed.

8. The apparatus as recited in claim 7, wherein a thermal conductivity of the first non-silicon heat sink is greater than a thermal conductivity of the first silicon-based heat sink.

9. The apparatus as recited in claim 7, further comprising:
   a second non-silicon heat sink disposed on the second silicon-based heat sink.

10. The apparatus as recited in claim 9, wherein a thermal conductivity of the second non-silicon heat sink is greater than a thermal conductivity of the second silicon-based heat sink.

11. The apparatus as recited in claim 9, wherein the second portion of the second silicon-based heat sink comprises at least one additional opening, and wherein a portion of the second non-silicon heat sink aligned with the second portion of the second silicon-based heat sink comprises an opening such that at least a portion of a surface of the second electrically-driven device facing the second silicon-based heat sink is exposed through the at least one additional opening of the second silicon-based heat sink and the opening of the second non-silicon heat sink when the second electrically-driven device is disposed between the first silicon-based heat sink and the second silicon-based heat sink.

12. The apparatus as recited in claim 1, further comprising:
   the first electrically-driven device disposed on the first portion of the first silicon-based heat sink and between the first silicon-based heat sink and the second silicon-based heat sink; and
   the second electrically-driven device disposed on the second portion of the first silicon-based heat sink and between the first silicon-based heat sink and the second silicon-based heat sink.

13. The apparatus as recited in claim 12, wherein the second electrically-driven device is electrically driven by the first electrically-driven device.

14. The apparatus as recited in claim 13, wherein the first electrically-driven device comprises a driver circuit, and wherein the second electrically-driven device comprises a laser diode or a sensor.

15. The apparatus as recited in claim 12, wherein the first electrically-driven device comprises a laser driver circuit or a radio frequency (RF) driver circuit.

16. The apparatus as recited in claim 12, wherein the second electrically-driven device comprises an edge-emitting laser, a vertical-cavity surface-emitting laser (VCSEL), or a photo-diode.

17. An apparatus, comprising:
   a first non-silicon heat sink;
   a first electrically-driven device;
   a second electrically-driven device;
   a first silicon-based heat sink disposed on the first non-silicon heat sink, the first silicon-based heat sink configured to receive the first electrically-driven device on a first portion of the first silicon-based heat sink and further configured to receive the second electrically-driven device on a second portion of the first silicon-based heat sink, the first silicon-based heat sink comprising a first groove or a first opening between the first portion and the second portion such that a heat conduction path between the first electrically-driven device and the first non-silicon heat sink through the first silicon-based heat sink is shorter than a heat conduction path between the first electrically-driven device and the second electrically-driven device through the first silicon-based heat sink; and a second silicon-based heat sink configured to be disposed on the first electrically-driven device and the second electrically-driven device such that the first silicon-based heat sink and the second silicon-based heat sink sandwich the first electrically-driven device and the second electrically-driven device therebetween with a first portion of the second silicon-based heat sink in contact with the first electrically-driven device and a second portion of the second silicon-based heat sink in contact with the second electrically-driven device, the second silicon-based heat sink comprising a second groove or a second opening between the first portion and the second portion of the second silicon-based heat sink, wherein the first electrically-driven device is disposed on the first portion of the first silicon-based heat sink and between the first silicon-based heat sink and the second silicon-based heat sink, and wherein the second electrically-driven device is disposed on the second portion of the first silicon-based heat sink and between the first silicon-based heat sink and the second silicon-based heat sink.

18. The apparatus as recited in claim 17, further comprising:
a second non-silicon heat sink disposed on the second silicon-based heat sink.

19. The apparatus as recited in claim 18, wherein a thermal conductivity of the first non-silicon heat sink is greater than a thermal conductivity of the first silicon-based heat sink, and wherein a thermal conductivity of the second non-silicon heat sink is greater than a thermal conductivity of the second silicon-based heat sink.

20. The apparatus of claim 17, wherein the first silicon-based heat sink comprises a first primary surface and a second primary surface opposite to the first primary surface, wherein the first primary surface of the first silicon-based heat sink is configured to be disposed on the first non-silicon heat sink, wherein the first and second electrically-driven devices are disposed on the second primary surface of the first silicon-based heat sink, wherein the second silicon-based heat sink comprises a first primary surface and a second primary surface opposite to the first primary surface, wherein the first primary surface of the second silicon-based heat sink is in contact with the first and second electrically-driven devices, and wherein either or both of the second primary surface of the first silicon-based heat sink and the first primary surface of the second silicon-based heat sink comprise one or more metallic patterns deposited thereon such that the first electrically-driven device is operable to drive the second electrically-driven device by providing electricity through the one or more metallic patterns when the first electrically-driven device and the second electrically-driven device are disposed between the first silicon-based heat sink and the second silicon-based heat sink.

* * * * *